US012322927B1

(12) United States Patent
Yap

(10) Patent No.: US 12,322,927 B1
(45) Date of Patent: Jun. 3, 2025

(54) INTEGRATED MULTISTRIPE LASER AND MODULATOR

(71) Applicant: HRL Laboratories, LLC, Malibu, CA (US)

(72) Inventor: Daniel Yap, Newbury Park, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 710 days.

(21) Appl. No.: 17/572,481

(22) Filed: Jan. 10, 2022

Related U.S. Application Data

(60) Provisional application No. 63/161,878, filed on Mar. 16, 2021.

(51) Int. Cl.
*H01S 5/40* (2006.01)
*H01S 5/00* (2006.01)
*H01S 5/125* (2006.01)
*H01S 5/22* (2006.01)

(52) U.S. Cl.
CPC .......... *H01S 5/4056* (2013.01); *H01S 5/0085* (2013.01); *H01S 5/125* (2013.01); *H01S 5/22* (2013.01)

(58) Field of Classification Search
CPC ............................ H01S 5/4025; H01S 5/4062
See application file for complete search history.

(56) References Cited

U.S. PATENT DOCUMENTS

| 10,451,951 B1 | 10/2019 | Yap et al. |
| 2010/0135346 A1* | 6/2010 | Peters ................... H01S 5/4062 372/29.011 |

OTHER PUBLICATIONS

W. K. Burns, G. K. Gopalakrishnan and R. P. Moeller, "Multi-octave operation of low-biased modulators by balanced detection," IEEE Photonics Technology Letters, v. 8, n. 1, pp. 130-132(1996).
C. Middleton and R. DeSalvo, "Improved microwave photonic link performance through optical carrier suppression and balanced coherent heterodyne detection," Proceedings SPIE vol. 7700, pp. 770008-1 to 770008-11 (2010).

(Continued)

*Primary Examiner* — Chad H Smith
(74) *Attorney, Agent, or Firm* — Ladas & Parry, LLP

(57) ABSTRACT

This invention combines a coherent multi-stripe laser array with a multi-stripe optical modulator. Light from different stripes of the multi-stripe laser are coupled to different stripes of the optical modulator. For example, the laser could comprise a first laser stripe, a second laser stripe, a third laser stripe and a fourth laser stripe. The modulator could comprise a first modulator stripe, a second modulator stripe, a third modulator stripe and a fourth modulator stripe. The light exiting from the first laser stripe is coupled directly into the first modulator stripe without being combined with the light the other laser stripes in an intervening optical channel waveguide. Likewise, the light exiting from the second laser stripe is coupled directly into the second modulator stripe without being combined with the light from the other laser stripes in an intervening optical channel waveguide. Similarly, the light exiting from the third laser stripe is coupled directly into the third modulator stripe and the light exiting from the fourth laser stripe is coupled directly into the fourth modulator stripe.

25 Claims, 16 Drawing Sheets

(56) References Cited

OTHER PUBLICATIONS

L. M. Augustin, et al, InP-based generic foundry platform for photonic integrated circuits, IEEE Journal of Selected Topics in Quantum Electronics, v. 24, n. 1, p. 6100210 (2018).

Mast A., Middleton C., Meredith S. and DeSalvo R., "Extending frequency and bandwidth through the use of agile, high dynamic range photonic converters," Proceedings 2012 IEEE Aerospace Conference.

Gasulla, I. and Capmany, J., "Analytical model and figures of merit for filtered microwave photonic links," Optics Express, v. 19, n. 20, p. 19758 (2011).

D. Yap, J. N. Walpole and Z. L. Liau, "Novel scalloped-mirrordiffraction-coupled InGaAsP/InP buried heterostructure laser arrays," Applied Physics Letters, v. 54, n. 8, p. 687 (1989).

J. Katz, S. Margalit and A. Yariv, "Diffraction coupled phase-locked semiconductor laser array," Applied Physics Letters, v. 42, n. 7, p. 554 (1983).

J. R. Leger, M. L. Scott and W. B. Veldkamp, "Coherent addition of AlGaAs lasers using microlenses and diffractive coupling," Applied Physics Letters, v. 52, n. 21, p. 1771 (1988).

J. T. Gallo, K. D. Breuer and J. B. Wood, "Millimeter wave frequency converting fiber optic link modeling and results," Proceedings SPIE vol. 3160, p. 106 (1997).

S. Shimotsu, et al., "Single side-band modulation performance of a LiNbO3 integrated modulator consisting of four phase modulator waveguides," IEEE Photonics Technology Letters, v. 13, n. 4, p. 364 (2001).

D. Yap, Z. L. Liau, D. Z. Tsang and J. N. Walpole, "High performance InGaAsP/InP buried heterostructure lasers and arrays defined by ion beam assisted etching," Applied Physics Letters, v. 52, n 18, p. 1464 (1988).

W. Streifer, D. Welch, J. Berger and D. Scifres, "Nonlinear analysis of Y-junction laser arrays," IEEE Journal of Quantum Electronics, v. 25, n. 7, p. 1617 (1989).

J. D. Kirch, et al., "5.5 W near-diffraction-limited power from resonant leaky-wave coupled phase-locked arrays of quantum cascade lasers," Applied Physics Letters, v. 106, p. 061113 (2015).

H. Yang, et al., "1.6W CW coherent power from large-index-step ($\Delta n \approx 0.1$) antiguided laser arrays," Proceedings SPIE vol. 3628, p. 228 (1999).

C. Zmudzinski, D. Botez, L. J. Mawst and C. Tu, "Coherent, one watt CW operation of large aperture resonant arrays of antiguides," Proceedings SPIE vol. 1850, p. 13 (1993).

J. Z. Wilcox, et al., "Design considerations for diffraction coupled arrays with monolithically integrated self imaging cavities," Applied Physics Letters, v. 54, n. 19, p. 1848 (1989).

J. Thomas, J. R. Leger, G. J. Swanson and M. Holz, "Coherent addition of laser arrays using binary-optics," IEEE LEOS Summer Topical Meeting on New Semiconductor Laser Devices and Applications, paper SCTh4 (1990).

M. Jansen, et al., "Injection locking of antiguided resonant optical waveguide (ROW) arrays," Proceedings SPIE vol. 1634, p. 21 (1992).

Y. Yamaguchi, et al., "Linearized LiNbO3 modulator with dual Mach-Zehnder interferometer and branched asymmetric CPW electrode," Proceedings 43rd European Conference on Optical Communication (ECOC) 2017 (published by IEEE).

A. Honardoost, R. Safian, A. Rao and S. Fathpour, "High-speed modeling of ultracompact electrooptic modulators," Journal of Lightwave Technology, v. 36, n. 24, p. 5893 (2018).

G. de Valicourt, et al., "Photonic integrated circuit based on hybrid III-V/silicon integration," Journal of Lightwave Technology, v. 36, n 2, p. 265 (2018).

T. Shimizu, et al., "Multichannel and high-density hybrid integrated light source with a laser diode array on a silicon optical waveguide platform for interchip optical interconnection," Photonics Research, v. 2, n. 3, p. A19 (2014).

K. Van Gasse, R. Wang and G. Roelkens, "27 dB gain III-V-on-silicon semiconductor optical amplifier with > 17 dBm output power," Optics Express, v. 27, n. 1, p. 293 (2019).

S. Aghaeimeibodi, et al., "Integration of quantum dots with lithium niobate photonics," Applied Physics Letters, v. 113, p. 221102 (2018).

M. Anagnosti, et al., "Record gain x bandwidth (6.1 THz) monolithically integrated SOA-UTC photoreceiver for 100-Gbit/s applications," Journal of Lightwave Technology, v. 33, n. 6, p. 1186 (2015).

Y. Zhang, et al., "Monolithic integration of broadband optical isolators for polarization- diverse silicon photonics," Optica, v. 6, n. 4, p. 473 (2019).

\* cited by examiner

*Electrode extends through lower SiO₂ cladding*

*Electrode is above the lower SiO₂ cladding*

*Electrode is above an extended LiNbO₃ slab*

Fig. 13a prior art
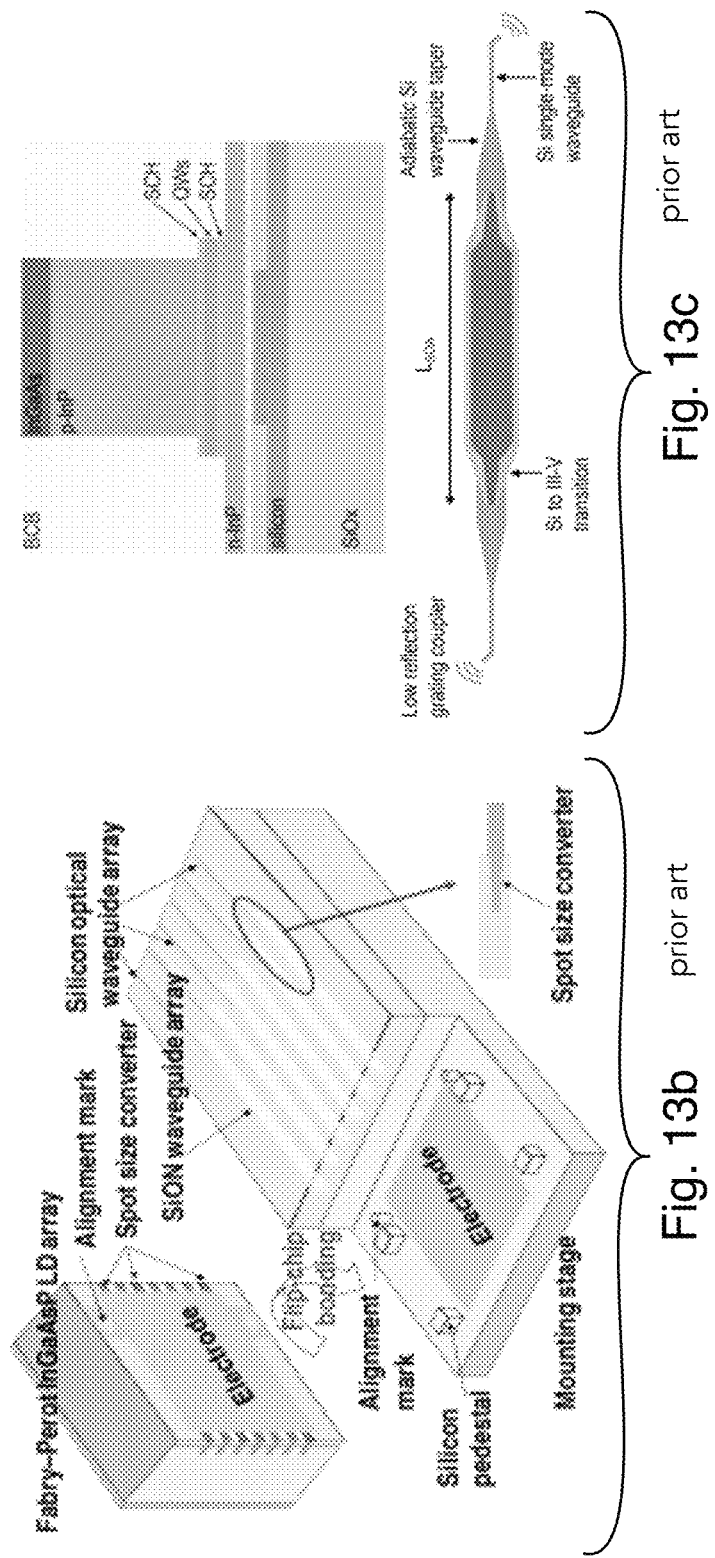
Fig. 13b prior art
Fig. 13c prior art

INTEGRATED MULTISTRIPE LASER AND MODULATOR

CROSS REFERENCE TO RELATED APPLICATIONS

This application claims the priority of U.S. Provisional Patent Application Ser. No. 63/161,878 filed 16 Mar. 2021 and entitled "Integrated Multi-stripe Laser and Modulator", the disclosure of which is hereby incorporated herein by reference.

STATEMENT REGARDING FEDERALLY SPONSORED RESEARCH OR DEVELOPMENT

None.

TECHNICAL FIELD

Integrated multiple-stripe lasers and modulators.

BACKGROUND

Lasers have a gain medium to amplify the light, the gain medium is typically elongate, thus called a stripe herein. For the lasers described herein, a laser stripe comprises a gain medium that is part of an optical waveguide. The gain medium of a laser is typically disposed in a cavity having reflecting mirrors on either end of the gain medium. One of the mirrors is typically partially transparent allowing some of the light to escape the cavity at an output thereof. In order to amplify the light in the cavity, the laser gain medium is supplied energy by another light source and/or by an electrical energy source. For the multi-stripe lasers described herein, the light produced by the laser is confined by the optical waveguide of those laser stripes and by the reflectors present in the structure and the energy supplied to the gain medium is electrical energy.

Prior lasers typically have their output obtained from a single stripe that produces a single optical beam. Some prior lasers comprise an array of multiple stripes whose outputs are coherent. When the laser output is obtained from multiple stripes, the laser output is combined and formed as a single optical beam that can then be focused into an optical channel waveguide or an optical fiber or an aperture. Typically, the purpose for having a multiple-stripe laser array with coherent output is to increase the power in their combined output beam. In addition, prior modulators such as Mach-Zehnder interferometric modulators typically have their input in a single stripe, a channel waveguide. The input stripe then branches into multiple stripes or multiple channel waveguides. The amplitude and phase of the optical fields in these multiple stripe or channel waveguides of the prior modulators can then be modulated. For Mach-Zehnder interferometric modulators, at least some of multiple stripes or channel waveguides are then combined together into a single output stripe. The technology disclosed herein avoids the optical losses as well as the limitations on maximum optical-power typically associated with the extra combining and branching structures and functions utilized in the prior art, which structures and functions are located between the laser stripe outputs and the modulator stripe inputs, since those combining and branching structures and functions are not required in the presently disclosed technology.

As noted above, prior lasers that are optically coupled to optical modulators are typically single-stripe lasers or are lasers having a single optical output that is coupled to the optical modulator. If multiple laser stripes have their output light coupled to multiple modulator stripes, the prior devices involve a combination of separate single-stripe lasers that are optically coupled to separate modulators, as illustrated, for example, in FIG. 1a. In this exemplary prior art device, each modulator is a Mach-Zehnder interferometer (MZI) that has two modulator stripes (See L. M. Augustin, et al, "InP-based generic foundry platform for photonic integrated circuits, *IEEE Journal of Selected Topics in Quantum Electronics*, v. 24, n. 1, p. 6100210 (2018), the disclosure of which is hereby incorporated herein by reference). In FIG. 1a, the light from a given laser stripe is coupled to a single input waveguide of a modulator. An optical-waveguide splitter divides that light into the two modulator stripes. An optical-waveguide combiner located downstream of the modulator stripes then combines the light that exits the two modulator stripes.

For some prior-art combinations of a laser and a modulator, the modulator is more complex and could comprise more than two stripes. A prior art device shown in FIG. 1b has a modulator that comprises two parallel MZIs that are nested in an outer MZI (See Mast A., Middleton C., Meredith S. and DeSalvo R., "Extending frequency and bandwidth through the use of agile, high dynamic range photonic converters," *Proceedings 2012 IEEE Aerospace Conference*, the disclosure of which is hereby incorporated herein by reference). Light from a single stripe laser is coupled into an input waveguide of the outer MZI. That light is then divided by an optical coupler to the two parallel MZIs. In each of those two parallel MZIs, the light is further divided by an optical splitter into the parallel modulator paths or stripes. A nested set of three optical couplers combines and optically interferes the light that exits the four parallel modulator stripes. For these modulators, it is important that the laser light in the separate modulator stripes be coherent with each other so that the optical inference that produces an intensity modulation from the phase modulations produced in the modulator stripes can be done.

FIG. 1c illustrates a prior art device for which the laser light supplied to the modulator is produced by multiple laser stripes. In this case, there are two laser stripes (the CW Laser and the Local Oscillator each have a stripe), with each laser stripe part of a different laser. (See Middleton C. and DeSalvo R., "Improved microwave photonic link performance through optical carrier suppression and balanced coherent heterodyne detection," *Proceedings SPIE* Volume 7700, p. 770008 (2010)). This modulator structure of this device has two separate stripes or paths that are part of a MZI modulator. A third path is implemented as an optical fiber. A set of two optical couplers combines and interferes the light exiting these three paths. The output from the final optical coupler is supplied to a pair of photodetectors. For this overall device to operate properly, the two lasers must be phase-locked together. A complicated optoelectronic circuit is used to accomplish the phase locking, since those two laser stripes are not part of the same laser but rather are part of different lasers.

FIG. 1d illustrates a prior art device that accomplished a similar function as the prior art device of FIG. 1c. However, for the device of FIG. 1d, a single laser stripe supplies the laser light for all three of the modulator stripes (See Gasulla, I. and Capmany, J., "Analytical model and figures of merit for filtered microwave photonic links," *Optics Express*, v. 19, n. 20, p. 19758 (2011), the disclosures of which are hereby incorporated herein by reference). The laser light coupled into the three modulator stripes is supplied through a nested combination of two optical-waveguide splitters.

Since the laser light in these three modulator stripes is supplied from the same coherent laser, that light is coherent. Likewise, the light exiting the three modulator stripes to be combined and interfered together is coherent.

In applications of a combined laser and modulator such as for generating RF waveforms or signals at the output of the photodetector and/or for processing and transmitting RF signals supplied to the modulator, with the processed RF signal produced at the output of the photodetector, it is beneficial to have high levels of the laser power coupled into at least several of the multiple modulator stripes. Several of the prior art devices achieve coherence of the laser light in the multiple modulator stripes by having the input laser light produced by a single laser stripe and then coupled into a single input waveguide of the modulator structure. That laser light is then split or divided among the multiple modulator stripes. As a result, the output laser power in the single laser stripe is much higher and the laser power in the single input waveguide of the modulator structure also is much higher than the laser power in any one of the modulator stripes. The power-handling limitations of the single laser stripe, of the single input waveguide of the modulator structure and of the interface between that laser stripe and that input waveguide will reduce the level of laser power that can be in each of the multiple modulator stripes. The structure described herein enables the laser power in each of the modulator stripes to be at least two times higher to ten or more times higher than can be achieved following the teachings of the prior art.

So far as the inventor is aware, there is no prior art that has the output from coherent multiple stripe lasers coupled into separate stripes of a multiple stripe modulator without having that light go first into a common input waveguide of the modulator. The closest prior art is believed to be the device depicted in FIG. 1c, for which the multiple laser stripes actually are part of different laser devices rather than being part of the same laser device.

Some examples of multi-stripe modulators are given above. There are prior art examples of coherent multi-stripe laser arrays, which are single laser devices. Several of these examples are described in more detail below. These prior coherent multi-stripe laser arrays have all been used to generate an optical output beam, preferably a single output beam, in which the light emitted from the multiple laser stripes is combined together. To couple that laser light into an optical modulator, one would couple the single output beam from the laser into a single input waveguide of the modulator. For the prior uses of coherent multi-stripe laser arrays, it was considered undesirable to produce multiple output beams. See e.g., D. Yap, J. N. Walpole and Z. L. Liau, infra; J. Katz, S. Margalit and A. Yariv, infra; J. R. Leger, M. L. Scott and W. B. Veldkamp, infra; W. Streifer, D. Welch, J. Berger and D. Scifres, infra; J. D. Kirch, et al., infra; and C. Zmudzinski, D. Botez, L. J. Mawst and C. Tu, infra. Instead, much effort was done to avoid the production of multiple output beams.

For the prior coherent multi-stripe laser arrays, only the combined light from the multiple laser stripes was used. The light from the individual stripes of a prior multi-stripe laser was never used separately, without first being combined with light from other stripes of that laser. In the present invention, this teaching of prior art is not followed, instead light from different stripes of the multi-stripe laser are independently coupled to different stripes of the optical modulator.

BRIEF DESCRIPTION OF THE INVENTION

This invention combines a coherent multi-stripe laser array with a multi-stripe optical modulator. Light from different stripes of the multi-stripe laser are coupled to different stripes of the optical modulator. For example, the laser could comprise a first laser stripe, a second laser stripe, a third laser stripe and a fourth laser stripe. The modulator could comprise a first modulator stripe, a second modulator stripe, a third modulator stripe and a fourth modulator stripe. The light exiting from the first laser stripe is coupled directly into the first modulator stripe without being combined with the light from the other laser stripes in an intervening optical channel waveguide. Likewise, the light exiting from the second laser stripe is coupled directly into the second modulator stripe without being combined with the light from the other laser stripes in an intervening optical channel waveguide. Similarly, the light exiting from the third laser stripe is coupled directly into the third modulator stripe and the light exiting from the fourth laser stripe is coupled directly into the fourth modulator stripe.

In some variations or embodiments of the present invention, the multi-stripe laser has another stripe whose output is not coupled to a modulator stripe but rather is coupled to one or more laser stripes via an optical feedback path. In some variations or embodiments, the output of this feedback path is coupled to at least one stripe of the multi-stripe laser, at the opposite end of the laser from the modulator.

In some variations or embodiments of the present invention, this feedback light serves as an optical injection locking input to the multi-stripe laser.

In some variations or embodiments of the present invention, the combination of the multi-stripe laser and the feedback path forms a ring-cavity laser.

In some variations or embodiments of the present invention, the optical feedback path further includes a spectral filter.

In some variations or embodiments of the present invention, the stripes of the laser are separated from the stripes of the modulator by a spacer region. This spacer region, and especially the length of the spacer, is designed to re-image the light exiting from the multiple laser stripes onto the input plane for the multiple stripes of the modulator. Such a spacer region accomplishes Talbot imaging. Talbot imaging can be used to increase the efficiency of coupling between the laser and the modulator stripes.

In some variations or embodiments of the present invention, the Talbot imaging effect is used to select a desired phase relationship between the light exiting the multiple laser stripes. In some of these variations or embodiments, one or more of the re-imaged laser spots is coupled to an optical feedback path that directs the coupled light back as an optical input to the laser array.

In some variations or embodiments of the present invention, the multiple light-emitting stripes of the laser have a lower effective refractive index for the guided light and the regions between adjacent light-emitting stripes have a higher effective refractive index for that light. The multiple stripes are coupled laterally to each other by means of leaky-wave coupling.

In some variations or embodiments of the present invention, the multiple light-emitting stripes of the laser have the light exiting one end of the multiple stripes coupled into a diffractive section with reflectors that enhance the coupling of light between adjacent laser stripes but reduce the reflection of light back to the original laser stripe.

In some variations or embodiments of the present invention, the multiple light-emitting stripes of the laser have a branching structure that divides or combines the light of adjacent stripes.

While combiners and splitters are advantageously omitted between the laser stripes and the modulator stripes, in some variations or embodiments the multi-stripe modulator further includes at least one optical combiner or optical coupler that is located on the end of the modulator stripes opposite the end facing the multi-stripe laser array. This optical coupler is connected to two stripes of the multi-stripe modulator.

In some variations or embodiments of the present invention, at least one stripe of the multi-stripe modulator is coupled to an electrode. An electrical signal applied to the electrode modulates the phase of the light exiting that stripe which is coupled to the electrode.

In some variations or embodiments of the present invention, one or more stripes of the multi-stripe modulator are coupled to an electrode. An electrical signal applied to the electrode modulates the intensity of the light exiting that stripe which is coupled to the electrode.

This invention allows the total output power of the laser to be higher and the total input power for the modulator to be higher than available following the teachings of the prior art. The lasers (laser stripes) may be integrated together with the stripes (waveguides) of the modulators. The laser stripes and the modulator stripes are preferably integrated on the same chip or the same multi-chip substrate. In some variations or embodiments, the laser stripes of the laser array and the modulator stripes are connected directly to each other. This invention also allows the modulator to be coupled essentially to multiple phase-locked or mutually coherent lasers. The embodiments of the present invention enable a RF-photonic system to be designed that uses an integrated laser-modulator to achieve lower noise figure, lower phase noise, improved linearity, higher net gain, and more-efficient frequency up/down conversion.

Some embodiments of the present invention comprise a multi-stripe ring-cavity laser that can have higher phase stability and narrower spectral linewidth for the emitted laser light. Yet, much of the emitted laser light can be coupled to the modulator. Only a portion of the emitted laser light is used for providing the ring cavity feedback. A traveling-wave ring cavity laser can avoid problems of localized regions of high optical power that are detrimental to linear-cavity lasers, such as Fabry-Perot cavity lasers.

The light coupled into the multiple modulator stripes are inherently phase locked, since the same laser produces that light. Thus, different laser stripe outputs can function like different phase locked lasers. Such configurations of multiple phase locked lasers are useful for frequency up/down conversion and for RF generation.

Various configurations of optical modulator(s) can be implemented with the present invention. One example is a modulated interferometer (MI) whose output light can have its intensity modulated. Another example has two MIs arranged optically in parallel. Yet another example is a set of multiple nested MIs. Such multiple MI configurations can achieve single-sideband modulation, linearized modulation, quadrature modulation, suppressed-carrier modulation, optical-comb modulation, and frequency-converted modulation.

Other optical-waveguide components such a as adjustable couplers, photodetectors and ring resonators can be coupled to the modulator stripes to enable even greater functionality.

One example of a device obtained by combining the integrated multi-stripe laser and multi-stripe modulator with one or more photodetectors is a frequency tunable RF source that also has a fixed frequency reference. Such a source can be used to produce a frequency-modulated continuous wave (FMCW) millimeter-wave signal for applications such as radar. The source also can produce a millimeter-wave local oscillator (LO) signal that is used to down-convert the radar return signal to a low intermediate frequency (IF) range compatible with lower-cost electronic circuits. Because the FMCW signal and the LO signal are both derived from the same laser, just different stripes of that laser, the phase noise of the down-converted signal can be very low. Thus, the range resolution of the radar system can be better.

Another example is a source of both an FMCW optical signal and a CW optical signal for which the frequency spacing between the FMCW optical signal and the CW optical signal can be adjusted. Such a source is useful for LiDAR applications. Having both optical signals allows the heterodyned result of those two signals to be placed at an IF rather than at baseband. The source can have narrow spectral linewidth since the laser is operated CW, with the modulator establishing the FM output. Also, this source can produce both an upward chirp and a downward chirp simultaneously and is capable of multi-GHz chirp bandwidth and multi-GHz repetition rates.

BRIEF DESCRIPTION OF THE DRAWINGS

FIGS. 13a-13c depict examples of methods to physically integrate the laser material and structures with the modulator material and structures.

DETAILED DESCRIPTION

Figure 1A:
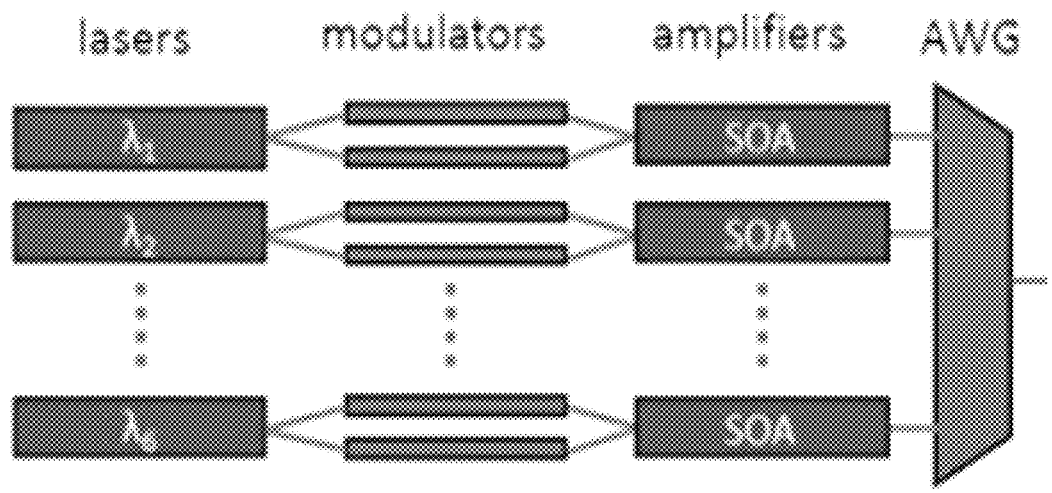
FIGS. 1a-1d present examples of prior art devices that combine one or more laser stripes with a multi-stripe optical modulator structure.
Figure 1B:
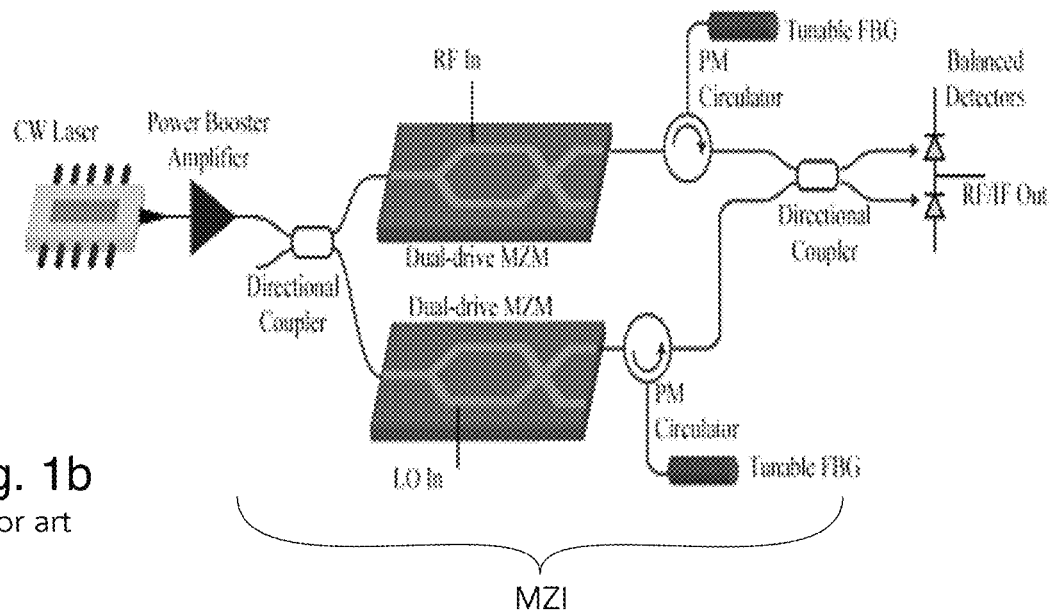
Figure 1C:
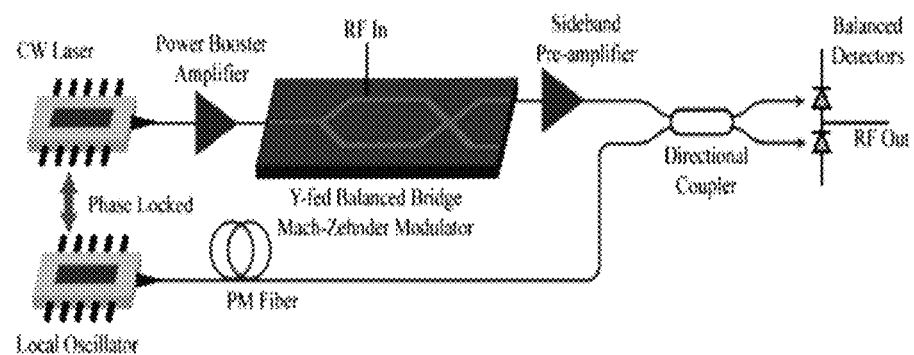
Figure 1D:
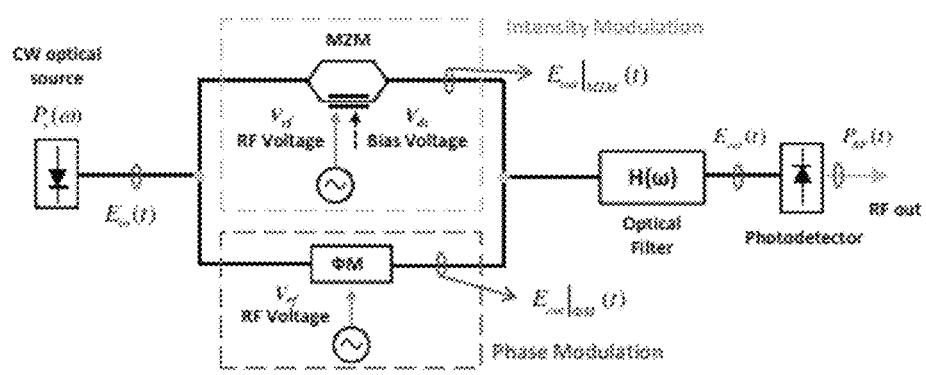

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

To describe the key features of this invention, we first give several examples of structures (embodiments of the invention) that combine a coherent multi-stripe laser with a multi-stripe modulation device. The multi-stripe laser produces laser light that is output from multiple distinct optical ports. This light from the various optical ports is coherent with each other and is phase-locked to each other, since the light is derived from the same laser. The multi-stripe modulator has the light in at least one of its stripes modulated by an external input. This external input alters the phase or amplitude of the light in that stripe. In the examples discussed in this disclosure, this external input is in electrical form, such as an electrical voltage or current, but the external input also could be in other forms such as electric field, magnetic field, electromagnetic radiation, temperature, humidity and a chemical species. The light from one or more of the modulator stripes can be coupled to a photodetector. The photodetector produces an electrical signal from the optical signal.

A physical demonstration of this invention has not yet been made, we discuss several examples of prior approaches for coherent multi-stripe lasers and for multi-stripe modulator structures. These discussions are intended to illustrate the feasibility of the present invention. In particular, we give examples of how specific features used in the invention to foster coherence between the light produced in the multiple laser stripes have already been demonstrated in some prior multi-stripe laser structures but are adapted to suit the purposes of this invention. Furthermore, several different examples of prior electrically controlled multi-stripe modulator structures are cited herein to illustrate the diversity of modulation function that can be accomplished with this invention and the diversity of applications for this invention. See A. Mast, C. Middleton, S. Meredith and R. DeSalvo, supra; C. Middleton and R. DeSalvo, supra; I. Gasulla and J. Capmany, supra; J. T. Gallo, K. D. Breuer and J. B. Wood, infra; S. Shimotsu, et al., infra; W. K. Burns, G. K. Gopalakrishnan and R. P. Moeller, infra; and Y. Yamaguchi, et al., infra. Finally, we provide several examples of electrically controlled modulator stripes and their electrodes and several methods for fabricating integrated lasers, modulators and photodetectors are discussed herein.

In the following paragraphs, several illustrative examples of embodiments of the invention are given and the examples are utilized to discuss in more detail specific features of the multi-stripe laser portion of the combined structure (which also is called a laser array) that are useful for achieving coherence between the light output from the various ports of the laser. For each example or embodiment, a different variation of the multi-stripe modulator portion of the combined structure is disclosed and discussed. These examples of various embodiments of multi-stripe modulators are given to illustrate the diverse functions of such modulator devices. Many different arrangements or combinations are possible of the various multi-stripe laser portions and the various multi-stripe modulator portions, as well as of the photodetectors and their coupling to the modulator portions. Furthermore, many other functions or applications are possible besides the ones discussed with reference to the examples given below.

A Mach-Zehnder interferometer (MZI) has an input splitter (or coupler with two outputs) that precedes the two waveguide paths that can contain phase modulators, followed by a combiner (or a coupler with two inputs). In the presently disclosed technology, the two waveguide paths of the modulator interferometer (MI) are connected directly to two stripes of the same laser so that the input splitter (typically present in a prior art MZI) is not needed.

The accompanying figures are intended to illustrate the functional arrangements of the various elements in the disclosed structures rather than any preferred or necessary physical arrangement thereof.

Figure 2:
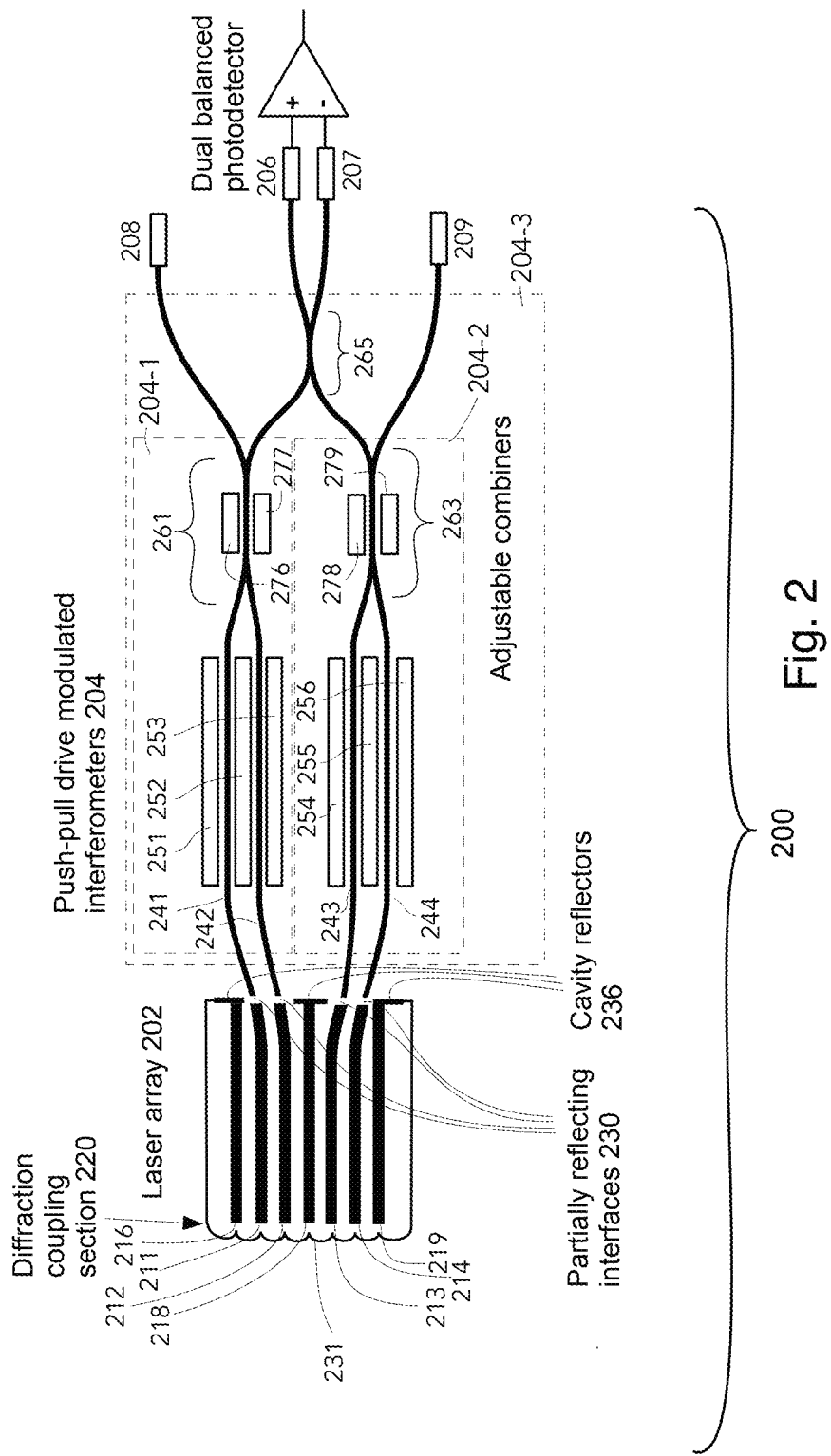
FIG. 2 depicts an embodiment of an integrated multi-stripe laser and multi-stripe modulator with diffraction-coupled laser stripes and push-pull driven pairs of modulator stripes.

Embodiment 1: Multiple Diffraction-Coupled Laser Stripes with Modulator Stripes Forming a Nested, Dual-Parallel Modulated Interferometer FIG. 2 shows an example or embodiment of a photonic source 200, this embodiment comprising a multi-stripe laser 202 integrated with a multi-stripe modulator 204. Light from the different stripes of the multi-stripe laser 202 is coupled among each other by means of a diffraction section 220. Each laser stripe can have very strong 2D confinement of its wave-guided light, such as by means of a buried heterostructure (See D. Yap, J. N. Walpole and Z. L. Liau, "Novel scalloped-mirror diffraction-coupled InGaAsP/InP buried heterostructure laser arrays," *Applied Physics Letters*, v. 54, n. 8, p. 687 (1989), the disclosure of which is hereby incorporated herein by reference).

The light in the diffraction coupling section has only 1D confinement, in the out-of-plane dimension, and diverges along the in-plane dimension. After being reflected from the end of the diffraction coupling section 220, a first portion of the light from a given laser stripe 211-219 will be coupled back into that laser stripe. A second portion of the reflected light from a given laser stripe will overlap with the adjacent laser stripes and couple into those adjacent laser stripes. A third portion of the reflected light will not overlap with any laser stripe and could be lost (such as by being absorbed in the substrate or the metal portions of the laser). The length of the diffraction section can be chosen to ensure that the portion of the reflected and coupled light (or optical fields) from the given stripe and from the adjacent stripes are in phase (See J. Katz, S. Margalit and A. Yariv, "Diffraction coupled phase-locked semiconductor laser array," *Applied Physics Letters*, v. 42, n. 7, p. 554 (1983), the disclosure of which is hereby incorporated herein by reference).

The length of the diffraction section also can be chosen to produce a Talbot re-image of the light emitted from the set of laser stripes back onto those stripes, thereby minimizing the amount of light in the third portion (See J. R. Leger, M. L. Scott and W. B. Veldkamp, "Coherent addition of AlGaAs lasers using microlenses and diffractive coupling," *Applied Physics Letters*, v. 52, n. 21, p. 1771 (1988), the disclosure of which is hereby incorporated herein by reference).

The diffraction coupling section 220 is located on one end of the laser stripes 211-219. Some of these laser stripes are connected at their opposite end to stripes 241-244 of the multi-stripe modulator 204. A portion of the laser light exiting from each of these stripes 241-244 is coupled into the modulator stripe connected to that laser stripe through a partially reflecting interface 230. FIG. 2 shows that others of the laser stripes are not connected to modulator stripes but rather have cavity reflectors 236 at the end opposite the diffraction section. The stripes with laser light exiting the cavity and coupled to the modulator stripes are shown with a slight bend near the point of exit. Those bends reduce the reflection. But a bend is not necessary, as can be seen from the embodiment of FIG. 4, for example.

Figure 3B:
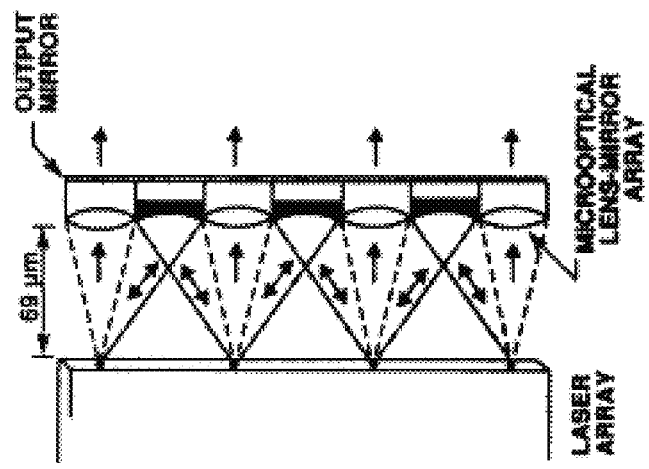
FIGS. 3(a) and 3(b) depict prior-art diffraction coupled laser arrays that have a diffraction-coupling section with a scalloped reflector. A segmented reflector allows laser light to pass through the spaces between the reflective segments.
Figure 3A:
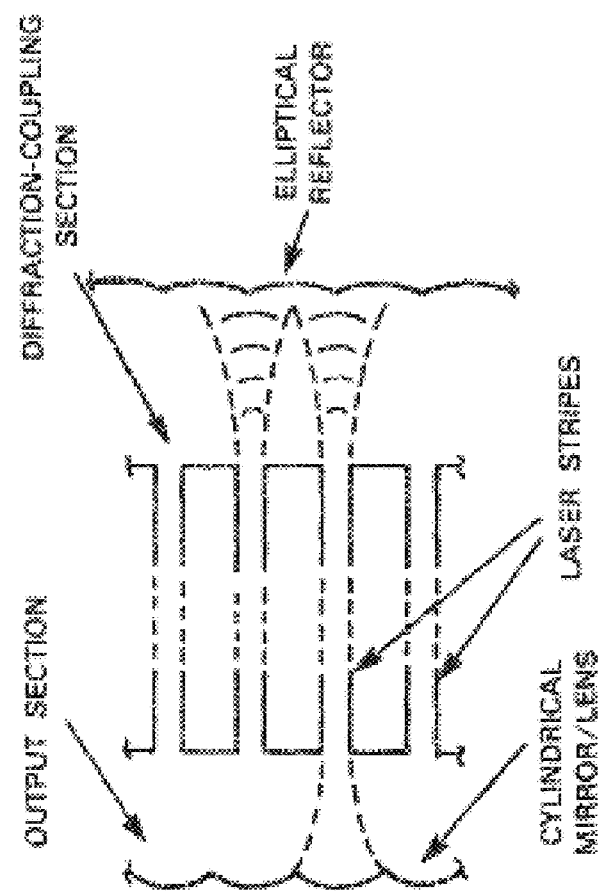

The reflecting surface 231 of the diffraction-coupling section 220 can have a periodic curved pattern to increase the portion of light coupled into the adjacent laser stripes and reduce the portion of light coupled into the original laser stripe (See D. Yap et al. supra). Such a "scalloped" reflector is shown in FIG. 3 (*a*) (see D. Yap et al. supra) and FIG. 3 (*b*) (see J. Thomas, J. R. Leger, G. J. Swanson and M. Holz, "Coherent addition of laser arrays using binary-optics," IEEE LEOS Summer Topical Meeting on New Semiconductor Laser Devices and Applications, paper SCTh4 (1990)). The greatest reflection occurs at the nearly flat portions of the "scalloped" reflector. These nearly flat portions are located half-way between adjacent laser stripes. Enhanced in-phase lasing of the multiple stripes can be achieved by setting the length of the "scalloped" diffraction section equal to a multiple of one-half the Talbot distance, so the total propagation distance through the diffraction section is equal to a multiple of the Talbot distance (See J. R. Leger, et al. supra).

FIG. 2 also shows an exemplary embodiment of a multi-stripe modulator 204. This modulator comprises four stripes 241-244 that are arranged as two sets of two stripes. Each set of two modulator stripes has their output end, the end opposite the laser array 202, connected together by an optical-waveguide combiner/coupler 261, 263. Each set of two output-connected modulator stripes acts as a modulated interferometer (MI) labeled as 204-1 and 204-2. In this embodiment, each set of two modulator stripes is operatively coupled with a set of electrodes (251-253 and 254-256) that provides a push-pull drive voltage that modulates the amplitude of the combined light output from that set. The outputs of the two sets of combined modulator stripes are further connected together by another optical-waveguide combiner/coupler 265. Thus, this multi-stripe modulator 204 has a nesting of multiple MIs; in this case two MIs 204-1 and 204-2 are further nested within MI 204-3. One or more electrodes 276, 277, 278, 279 can adjust the relative amplitudes and phases of the outputs from combiners 261, 263 and thus the two inputs to combiner 265 to achieve a desired overall combined output from combiner 265. The outputs from each MI set 204-1 and 204-2 can be converted into an electrical signal by a photodetector 208, 209. Also, the further combined and interfered outputs from both MI sets, as produced by MI 204-3, can be converted into an electrical signal by one or more additional photodetectors 206, 207. A dual-balanced photodetector pair is illustrated in this figure.

In particular, the embodiment of FIG. 2 has a photonic source, labeled 200, which comprises a multi-stripe laser or laser array 202 and a multi-stripe modulator 204. The multi-stripe modulator 204 may be embodied as push-pull driven Modulated Interferometers (MI). With a push-pull drive, the modulation voltage applied across one optical path of a two-path interferometer is equal to and opposite from the modulation voltage applied to the other path of that two-path interferometer. The multi-stripe laser 202 comprises a plurality of laser stripes 211, 212, 213 and 214 that are optically coupled to four modulator stripes 241, 242, 243 and 244. Four laser stripes or modulator stripes are shown in FIG. 2, but that number could be increased by some practicing the present invention. The multi-stripe laser further comprises additional laser stripes 216, 218 and 219. The number of additional laser stripes may be increased (or decreased) by some practicing the present invention. Each laser stripe comprises an optical waveguide that has a light-emitting region. Light is emitted and propagates along the length of each laser stripe. The multi-stripe laser or laser array 202 further includes a diffraction coupling section 220 which may comprise a diffraction coupling reflector 231 having, for example, a scalloped shape. The multi-strip modulator 204 comprises modulator stripes 241, 242, 243 and 244. One end of each of laser stripes 211, 212, 213 and 214 faces and optically couples with modulator stripes 241, 242, 243 and 244 and is coupled to modulator stripes 241, 242, 243 and 244 through partially reflecting interfaces 230, respectively. Four partially reflecting interfaces 230 are depicted by FIG. 2, but the number of partially reflecting interfaces 230 may be varied as desired. The opposite end of the laser stripes face and optically connect with the diffraction coupling section 220. One end of laser stripes 216, 218 and 219 faces or point towards to the multi-stripe modulator 214, but that end terminates at reflectors 236.

The reflectors 236 may comprise surfaces coated with a material, such as a metal such as titanium, platinum, silver or gold, that increases its reflectance of the emitted light. The reflectors 236 may alternatively (or additionally) be implemented as Bragg reflectors. The opposite end of these laser stripes 216, 218 and 219 faces and optically interact with the diffraction section 220. The reflective surface 231 of the diffraction section 220 opposite from the laser stripes can have a multi-curved or scalloped profile, as illustrated in FIG. 2. This surface 231 may alternatively have a flat or other profile or configuration. Reflective surface 231 of diffraction coupling section 220 may be formed with a material, such as a metal such as titanium, platinum, silver or gold, that increases its reflectance of the light emitted by the laser stripes.

A portion of each modulator stripe 241, 242, 243, 244 is disposed adjacent to one or more electrodes, 251, 252, 253, 254, 255 and 256. Six such electrodes are depicted by FIG. 2 but that number may change according to the particular needs of those practicing the present invention. A modulation signal such as a voltage or current is applied to these electrodes in order to modulate the phase of light propagating through each of the modulator stripes. Each modulator stripe 241, 242, 243, 244 may comprise an optical waveguide including a material, such as an electro-optic material or a thermo-optic material, whose refractive index can be changed as a result of an applied change in electric-field or temperature. One end of the modulator stripes 241, 242, 243, 244, faces and optically connects with the laser stripes. The opposite end of each of the modulator stripes is connected to one or more optical waveguide combiner/couplers 261, 263, and 265. The optical waveguide couplers are then connected to one or more photodetectors 208, 206, 207 and 209. Photodetectors 206 and 207 can be arranged in a dual-balanced configuration, as depicted.

Each optical waveguide combiner/couplers 261, 263 and 265, has two optical inputs and two optical outputs and actually comprises three parts (i) a 2-input combiner, (ii) an optical coupler (that typically comprises two parallel and coupled waveguides or a multi-mode waveguide), and (iii) a 2-output splitter. The relative amounts of light exiting the two outputs of the 2×2 coupler depend, in part, on the relative phases of the light entering its two inputs. The relative phases as well as the relative intensities of the light exiting the two outputs of the coupler also depend on the effective coupling length or coupling strength, which can be adjusted by applying a voltage or current to electrodes located adjacent to the waveguide(s) of the coupling section.

The optical inputs and outputs of the waveguide combiners/couplers 261, 263 and 265 may be connected to modulator stripes, other inputs and outputs of an optical waveguide coupler, or to photodetectors. For example, the two optical inputs of optical waveguide combiner 261 are connected to modulator stripes 241 and 242 of MI 204-1. One optical output of optical waveguide combiner/coupler 261 is connected to an input of optical waveguide combiner/coupler 265. Another optical output of optical waveguide combiner/coupler 261 is connected to photodetector 208. One or more of the optical waveguide combiners 261 and 263 may be disposed adjacent to one or more electrodes 276, 277, 278, 279. A control signal such as a voltage or current can be applied to these electrodes and can adjust the relative coupling of light from the two optical inputs to the two optical outputs of an optical waveguide combiner/coupler 261, 263. Optical waveguide combiner/coupler 265 also has two optical inputs and two optical outputs. The two optical inputs of combiner/coupler 265 are connected to one each of the two outputs of combiners/couplers 261 and 263, as described above.

As depicted in FIG. 2, modulator stripes 241 and 242 and optical waveguide combiner 261 form a first MI 204-1. Modulator stripes 243 and 244 and optical waveguide combiner 263 form a second MI 204-2. The combiners/couplers 261 and 263 each may comprise three elements: (i) a 2-input combiner, (ii) an optical coupler (that typically comprises two parallel and coupled waveguides or a multi-mode waveguide), and (iii) a 2-output splitter. One output from each of the combiners 261 and 263 is connected to an input of optical combiner/coupler 265. The paths through the outputs of combiners 261 and 263 that are connected to the two inputs of optical waveguide combiner/coupler 265 defines a third MI 204-3 in which the first MI and the second MI are nested. Electrodes 276-279 of combiners 261 and 263 can perform two functions. They can be used to adjust the bias point of interferometer 204-3 (i.e. the relative phase of the light in the two paths) and they can also be used to adjust the relative optical power of the light in the two paths in MI 204-3 by applying suitable voltages thereto. Thus, the relative phases as well as the relative intensities of the light exiting the two outputs of the combiners/couplers 261 and 263, and entering the two inputs of the combiner/coupler 265, depend on the effective coupling length or coupling strength, which can be adjusted by applying a voltage or current to electrodes 276-279 located adjacent to the waveguide(s) of the coupling section in each of the combiner/couplers 261 and 265.

One application of the embodiment of an integrated laser/modulator shown in FIG. 2 is to provide up-conversion or down-conversion of an RF signal. For up-conversion, an RF signal at an intermediate frequency (IF) band is supplied to the drive electrodes for one of two MI sets, such as the upper MI set 204-1 shown in the FIG. 2. An RF local oscillator (LO) waveform is supplied to the drive electrodes for the other of the two MI sets, such as the lower set 204-2 shown in FIG. 2. The output from the dual balanced photodetector pair is the up-converted signal. For example, the IF band is around 1 GHZ, the LO frequency is 76 GHz and the center frequency of the output is at 77 GHz. An example of the IF signal is a chirped (frequency modulated) waveform suitable for FMCW radar. For down-conversion, the radar return waveform, centered at 77 GHz is supplied to the first MI set and the LO waveform is supplied again to the second MI set. The output from the photodetector pair is at the 1 GHz IF band (See J. T. Gallo, K. D. Breuer and J. B. Wood, "Millimeter wave frequency converting fiber optic link modeling and results," Proceedings SPIE Volume 3160, p. 106 (1997), the disclosure of which is hereby incorporated herein by reference).

The overall structure of the embodiment of FIG. 2 has three MIs, 204-1, 204-2 and 204-3. The RF (IF or LO) drive signal may be supplied only to the drive electrodes of MI 204-1 and/or 204-2 while a DC drive signal (or phase shifter voltage) may be supplied to the electrodes of MI 204-3.

The relative lengths of the two modulator stripes in each MI set 204-1 and 204-2 are selected to establish a desired bias point for the interferometer. The MI may be biased at quadrature by setting the relative lengths of those stripes equal. The MI may be biased at a null point, for which the output from that MI has light at the laser frequency diminished (or suppressed) by setting the relative lengths to produce a relative phase shift of n radians for the unmodulated laser light in the two stripes.

Figure 4:
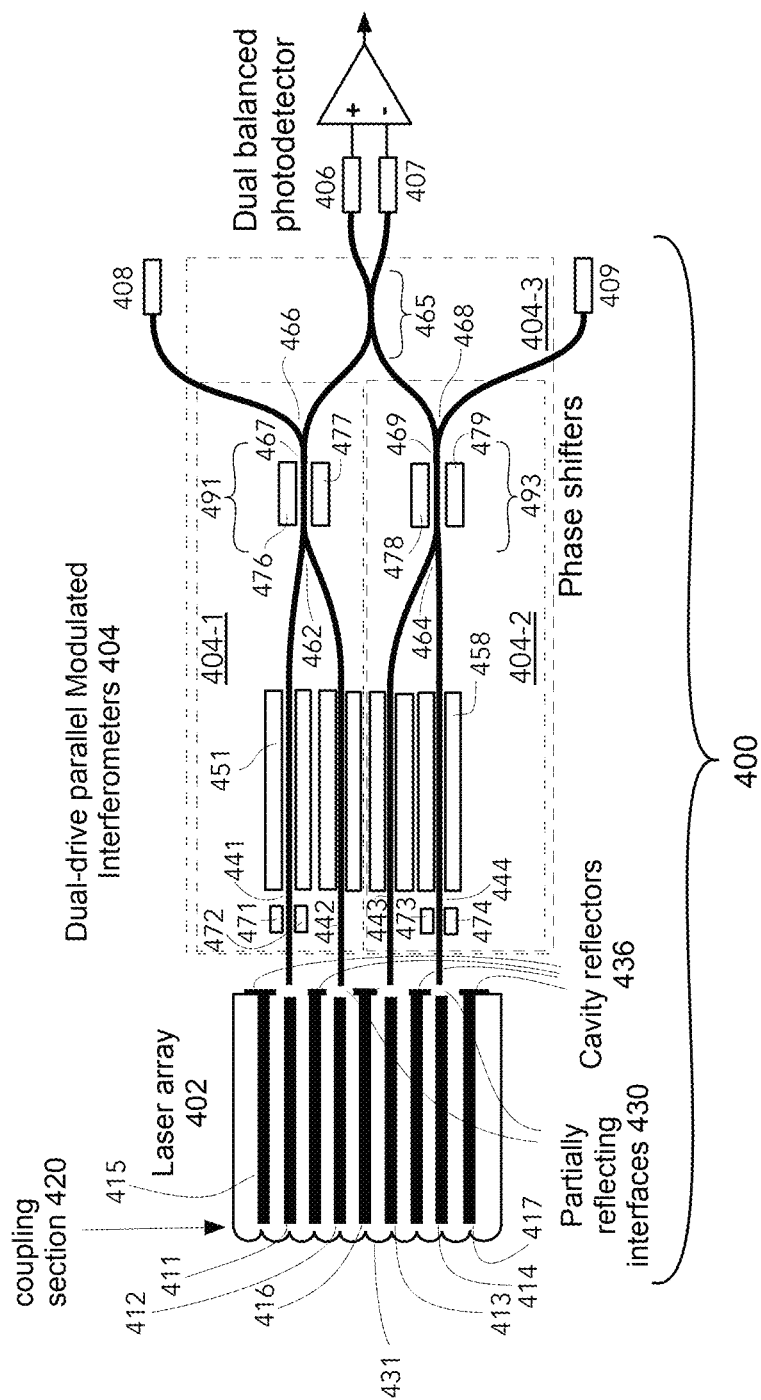
FIG. 4 depicts an embodiment of a multi-stripe laser integrated with multi-stripe modulator; with the laser stripes coupled by a diffraction section and the modulator stripes having separate drive electrodes.

Embodiment 2: Multiple Diffraction-Coupled Laser Stripes with Nested Dual-Drive MZI Modulator Stripes Forming Nested Dual-Drive Interferometers FIG. 4 shows another embodiment of a photonic source, labeled 400 in this embodiment, which comprises an integrated multi-stipe laser 402 and multi-stripe modulator 404. Similar to the embodiment of FIG. 2, the multiple laser stripes are coupled together by means of a diffraction section 420. When the coupling among the laser stripes is sufficiently strong, the entire collection of laser stripes acts like one laser, sometimes called a coherent laser array 402. The light exiting the multiple laser stripes are phase-locked with each other and are at the same wavelength (or optical frequency). To achieve stronger phase locking, it is desirable to have the diffraction coupling section 420 couple light not only to nearest neighbor stripes but also to even more distantly located stripes. This can be accomplished by increasing the length of the diffraction-coupling section. By also choosing the diffraction section to be several multiples of one-half the Talbot distance, one can maximize the coupling back into the laser stripes (see J. R. Leger, et al. supra).

In particular, FIG. 4 depicts a photonic source 400 comprising a multi-stripe laser or laser array 402 and a multi-stripe modulator 404. The numbering of the various elements in this embodiment is similar to that of FIG. 2, but instead of the element numbers being in the two hundred series, the element numbers in this embodiment are in the four hundred series, but the last two numbers in both series refer to common or at least functionally similar elements. The multi-stripe laser 402 comprises laser stripes (see the stripes numbered 411-417). Each laser stripe is an optical waveguide that has a light-emitting region. Light is emitted and propagates along the length of each laser stripe 411-417. The multi-stripe laser array 402 includes a diffraction section 420. The multi-stripe modulator 404 comprises modulator stripes 441, 442, 443 and 444. One end of laser stripes 411, 412, 413 and 414 faces modulator stripes 441, 442, 443 and 444 and is coupled to modulator stripes 441, 442, 443 and 444 through partially reflecting interfaces 430, respectively. The partially reflecting interfaces are described in greater detail below. The opposite end of these laser stripes face towards the diffraction section 420. One end of laser stripes 415-417 faces towards the multi-stripe modulator 404, with that end terminating in a reflector 436.

The descriptions given above of the reflectors 236 of photonic source 200 of the embodiment of FIG. 2 also can apply to the reflectors 436 of photonic source 400 of the embodiment of FIG. 4. The number of reflectors 236 or 436 may be changed to suit, for example, the number of laser stripes that are terminated at those reflectors. The reflective surface 431 of the diffraction section 420 opposite from the laser stripes 411-417 and the reflectors 436 and the partially reflecting interfaces 430 define a laser cavity of the multi-stripe laser 402. Thus, each laser stripe 411-417 may be considered as being in its own separate laser cavity that is optically coupled to the laser cavities of the other laser stripes of the multi-stripe laser 402, which has multiple laser stripes functionally arranged in parallel to each other. One also can consider the multi-stripe laser 402 as comprising a single inclusive laser cavity whose two ends are defined by the reflectors 431 and 436. The emitted light then passes through the laser stripes 411-417, in succession and being coupled from one laser stripe to another laser stripe via the diffraction section 420 and its reflective surface 431.

In most cases, the laser stripes are disposed physically parallel to each other, although they do not need to be for the laser to work as is desired. In this document some of the laser stripes are intentionally shown as having bends. Those laser stripes are the ones that are connected to the modulator stripes. If an endface for the laser array is formed that is perpendicular to the nominally parallel laser stripes, the light exits the bent stripes at an angle relative to the endface. This reduces the back-reflection of the laser light from those interfaces between the laser stripes and the modulator stripes.

The descriptions given above for modulator stripes 241, 242, 243, 244 of photonic source 200 of the embodiment of FIG. 2 also apply to modulator stripes 441, 442, 443 and 444 of the photonic source 400 of the embodiment of FIG. 4. Furthermore, the descriptions provided above for optical waveguide combiner/coupler 265 of photonic source 200 apply also to optical waveguide combiner/coupler 465 of photonic source 400. One end of the modulator stripes 441, 442, 443, 444, faces the laser stripes of the laser array 402. The opposite end of each of the modulator stripes optically connects to an optical waveguide combiner 462, 464. Each optical waveguide combiner 462, 464 has two optical inputs and one optical output. The optical output of the combiner 462, 464 is connected to a waveguide segment 467, 469, respectively. Optical waveguide segments 467, 469 are then connected to inputs of optical waveguide splitters 466, 468. One of the two outputs of the optical waveguide splitter 466, 468 is connected to a photodetector 408, 409, respectively. The other output of the optical waveguide splitter 466, 468 is connected to one of the two inputs of combiner 465. The two outputs of combiner 465 are connected to photodetectors 406 and 407. One or more of the optical waveguide segments 467 and 469 can be adjacent to one or more electrodes 476, 477, 478, 479. These electrodes 476-479 and waveguide segments 467, 469 function as two phase shifters 491, 493 which can change the relative phases of the light exiting waveguide segments 467, 469 and entering the two inputs of combiner/coupler 465. A control signal such as a voltage or current can be applied to these electrodes and can adjust the relative phase shift of light in these two optical waveguide segments 467, 469. The phase shifter 491 includes the electrodes 476 and 477 and waveguide 467 while the upstream waveguide combiner 462 and downstream splitter 466 may conceptually be considered a part of the phase shifter 491 or at least closely associated therewith. Similarly, the phase shifter 493 includes the electrodes 478 and 479 and waveguide 469 while the upstream waveguide combiner 464 and downstream splitter 468 may conceptually be considered a part of the phase shifter 493 or at least closely associated therewith.

The photodetectors 408 and 409 in this embodiment and the photodetectors 208 and 209 in the embodiment of FIG. 2 facilitate the monitoring the relative splitting of power and the relative interference state of the interferometers 204-1 and 204-2 or 404-1 and 404-2 as well as of the combiners 261 and 263 or 462 and 464. The interference state is described by the modulator's "bias point".

As depicted in FIG. 4, modulator stripes 441 and 442 and optical waveguide combiner 462 form a first MI 404-1. Modulator stripes 443 and 444 and optical waveguide combiner 464 form a second MI 404-2. Optical waveguide segments 467, 469, optical waveguide splitters 466, 468 and optical waveguide coupler 465 define a third MI 404-3 in which the first MI and the second MI are functionally nested. One or more of the modulator stripes 441, 442, 443 and 444 can be disposed adjacent to one or more additional "bias adjuster" electrodes 471, 472, 473, 474. A control signal such as a voltage or current can be applied to these electrodes and can adjust the relative phase shift of light in these modulator stripes.

To form a laser, one needs to define a laser cavity or resonator. For a diffraction-coupled multi-stripe laser array, the end of the laser stripes opposite from the diffraction section would comprise one end of a Fabry-Perot cavity. Some light would be reflected from this end, which functions as a partially reflecting mirror (see elements 430 and 436 of the embodiment of FIG. 4, for example, which when considered together are partially reflecting). This end also is considered the output end of the laser array (402, in the case of the embodiment of FIG. 4), and is the end coupled to the modulator (404, in the case of the embodiment of FIG. 4). The light reflected from this output end of a given laser stripe, and back through the laser, can be coupled via the diffraction section (420, in the case of the embodiment of FIG. 4) into the other laser stripes. Thus, there can be a trade-off between the amount of light coupled from a given laser stripe into its corresponding modulator stripe and the amount of light contributing to the diffraction coupling among the laser stripes. When the diffraction coupling is stronger, the laser can be driven farther above its lasing threshold and still operate as a coherent multi-stripe laser rather than as separate (or independent) laser stripes. Thus, the overall output power from the multi-stripe laser can potentially be higher depending on the amount of inter-stripe coupling. For the embodiment of FIG. 4, every other laser stripe has a cavity reflector 436 located at the end opposite from the diffraction section 420. In comparison, every third laser stripe in the laser array 202 of FIG. 2 has a cavity reflector 236 located at the end opposite from its diffraction section 220. Thus, the laser of FIG. 4 can operate with adjacent stripes 180 degrees out-of-phase from each other. In this case, the length of the diffraction coupling section 420 can be a multiple of one-quarter of the Talbot distance or an odd multiple of one-quarter of the Talbot distance.

The multi-stripe modulator 404 in the embodiment of FIG. 4 comprises four stripes 441-444 that are arranged as two sets of two stripes thereby forming two MIs 404-1 and 404-2. Similar to the embodiment of FIG. 2, each set of two modulator stripes has their output end, the end opposite the laser array 402, connected together by an optical-waveguide combiner 462, 464. Each set of two output-connected modulator stripes acts as a Modulated Interferometer (MI). However, for the embodiment of FIG. 4, each set of two modulator stripes is coupled to a set of electrodes (numbered 451 . . . 458 on FIG. 4, but only the first and last electrode of this series is specifically numbered for ease of illustration) that provides separate drive voltage to the two modulator stripes of each MI set 404-1 and 404-2. These electrodes 451-458 modulate the relative phase of the light in the two modulator stripes and thus modulate the amplitude of the combined light output from that MI set. The outputs of the two MI sets 404-1 and 404-2 are further connected together by optical-waveguide combiner 465. Each MI also has electrodes that are used to adjust the bias point of that MI. Electrodes 476-479 adjust the bias point of a third MI 404-3, which includes combiner 465. For example, the bias point can be selected to be at quadrature bias or at null bias. While a pair of separate electrodes is depicted as being associated with each modulator stripe 441-444 in the embodiment of FIG. 4, the two electrodes between a pair of modulator stripes in a given MI set may be combined into a single electrode as can be seen in the embodiment of FIG. 2, should that be desired.

Having separate electrodes (represented by the rectangles numbered 451-458) for each modulator stripe 441-444 provides even greater flexibility in the functions that can be performed by the multi-stripe modulator 404. For example, one can produce a single-sideband modulated output with carrier suppressed by applying different phase-shifted versions of a RF signal to the four modulator stripes. The basic RF signal and a 180-degree phase shifted version of that RF signal are applied to the two stripes of the first MZI. A 90-degree phase shifter version and a 270-degree phase shifted version of the RF signal are applied to the two stripes of the second MZI (See S. Shimotsu, et al., "Single sideband modulation performance of a LiNbO$_3$ integrated modulator consisting of four phase modulator waveguides," *IEEE Photonics Technology Letters*, v. 13, n. 4, p. 364 (2001), the disclosure of which is hereby incorporated herein by reference). One also can produce a frequency shifted version of the single modulation sideband with a 4-stripe modulator structure. For another example, in-phase and quadrature (I and Q) versions of an RF signal are applied to the first MI and to the second MI, respectively. Such configurations can be used to achieve quadrature amplitude modulation (QAM) and quadrature phase-shift keying (QPSK), which are used for communications networks. For yet another example, one can obtain a QPSK signal by applying two different binary modulating signals to the two stripes of one MI set. A local oscillator waveform can then be applied to the other MI set to achieve frequency up/down conversion of the photodetector output.

Figure 5:
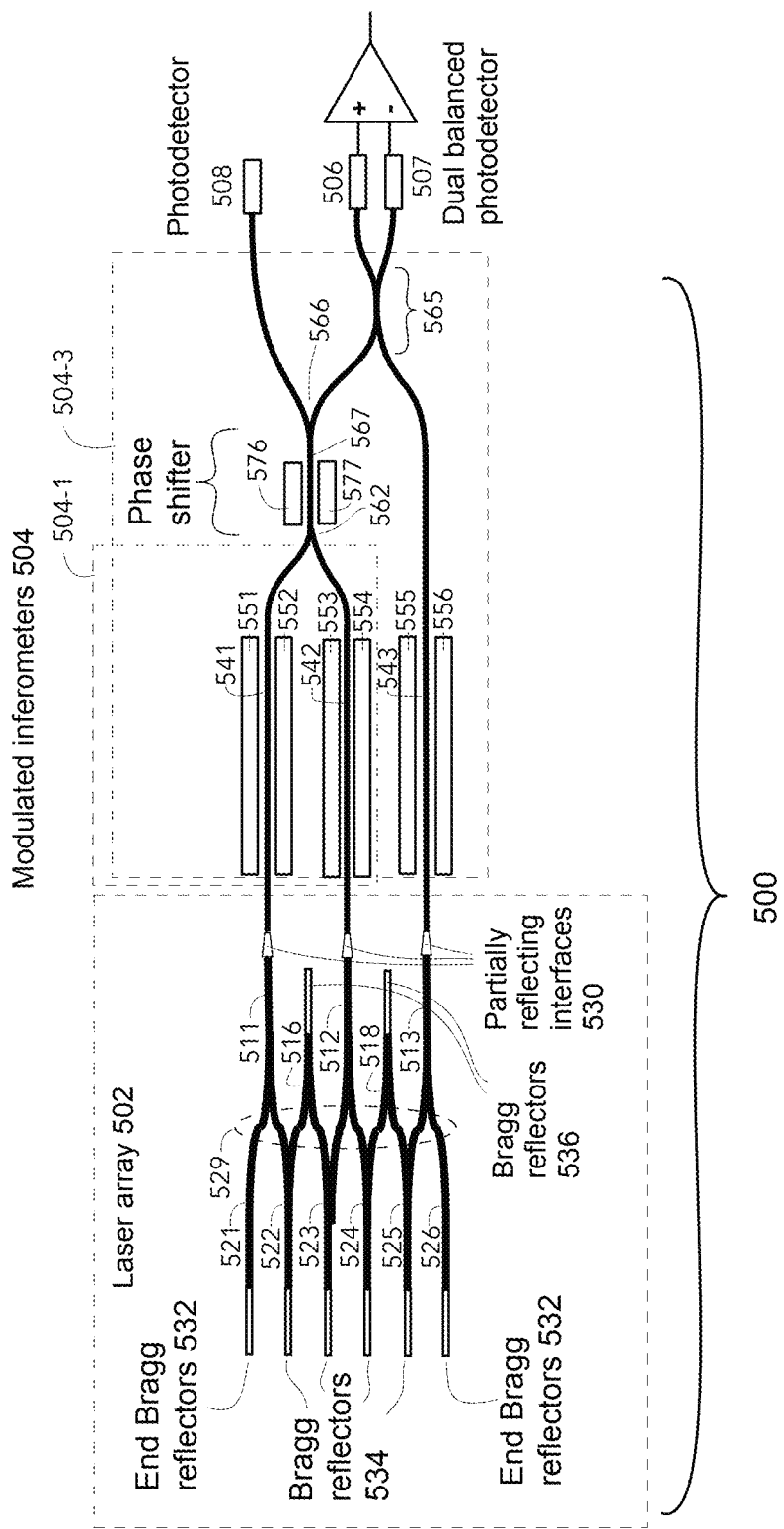
FIG. 5 depicts an embodiment of an integrated multi-stripe laser and multi-stripe modulator; laser stripes are connected by Y-junctions; modulator stripes form nested interferometers.

Embodiment 3: Multiple Y-Junction Coupled Laser Stripes with Three Parallel, Nested MZI Modulator Stripes Configured as Two Nested Modulated Interferometers FIG. 5 shows another embodiment of a photonic source, labeled 500 in this embodiment, which comprises a multi-stripe laser 502 integrated with a multi-stripe modulator 504. The numbering of the various elements in this embodiment is similar to that of FIGS. 2 and 4, but instead of the element numbers being in the two or four hundred series, the element numbers in this embodiment are in the five hundred series, but the last two numbers in all these series refer to common or at least functionally similar elements. For this embodiment, the laser stripes have a Y-branching configuration. The Y branches divide and combine light among each pair of two adjacent laser stripes. The light in each laser stripe is confined in a 2D waveguide (See D. Yap, Z. L. Liau, D. Z. Tsang and J. N. Walpole, "High performance InGaAsP/InP buried heterostructure lasers and arrays defined by ion beam assisted etching," *Applied Physics Letters*, v. 52, n 18, p. 1464 (1988), the disclosure of which is hereby incorporated herein by reference). In this embodiment, the laser has five stripes at the end facing the modulator and six stripes at the end facing away from the modulators. Also, the ends opposite the modulators are terminated with high-reflection Bragg-grating reflectors. Such a design can continue to maintain the desired in-phase array mode at higher laser drive levels and higher laser output power levels (see W. Streifer, D. Welch, J. Berger and D. Scifres, "Nonlinear analysis of Y-junction laser arrays," *IEEE Journal of Quantum Electronics*, v. 25, n. 7, p. 1617 (1989), the disclosure of which is hereby incorporated herein by reference).

The multi-stripe modulator of this embodiment has three stripes 541-543. Two modulator stripes 541, 542 have their output ends, the ends opposite from the laser array 502, combined together, by combiner 562, to form a Modulated Interferometer 504-1. The combined output from these two stripes (541 and 542) is further combined with the output end of the third modulator stripe (543), forming yet another Modulated Interferometer 504-3. Each modulator stripe can be driven with a separate set of electrodes. The structure also has another set of electrodes 576, 577 to adjust the relative phase shift between the output from the first MI formed by modulator stripes 541 and 542 and the output from the third modulator stripe 543. The output of the second combiner 565 is coupled to a dual balanced photodetector pair 506.

507. Another photodetector 508 may be utilized to monitor a second output from the splitter 566.

In particular, FIG. 5 depicts a photonic source 500 comprising a multi-stripe laser array 502 and a multi-stripe modulator 504. The multi-stripe laser array 502 comprises laser stripes 511, 512 and 513. The multi-stripe laser 502 further comprises laser stripes 516 and 518, with laser stripe 516 oriented parallel with and located between laser stripes 511 and 512, and with laser stripe 518 oriented parallel with and located between laser stripes 512 and 513. Laser stripes 516 and 518 are each terminated by a reflector element 536. The multi-stripe laser 502 further comprises supplemental laser stripes 521, 522, 523, 524, 525 and 526. These supplemental laser stripes 521-526 are connected at one end thereof to corresponding laser stripes 511, 516, 512, 518 and 513 through a Y-branch coupling region 529 and terminated at their other ends by reflector elements 532, 534. Each laser stripe is an optical waveguide that has a light-emitting region. Light is emitted and propagates along the length of each laser stripe. Light also can be emitted along the optical waveguides in the Y-branch coupling region 529. The multi-strip modulator 504 comprises modulator stripes 541, 542 and 543. One end of laser stripes 511, 512 and 513 faces modulator stripes 541, 542 and 543 and is respectively coupled to modulator stripes 541, 542 and 543 through partially reflecting interfaces 530. The opposite end of these laser stripes face and connect with the Y-branch coupling section 529. One end of laser stripes 516 and 518 faces towards the multi-stripe modulator 504, with that end terminating in reflector elements 536, which may be implemented as Bragg reflectors. Each partially reflecting interface 530 can be implemented as a Bragg reflector that has a smaller number of Bragg periods than the number of Bragg periods used for a highly reflecting Bragg reflector, such as reflectors 536.

The ends of the supplemental laser stripes 521, 522, 523, 524, 525 and 526 that are distal from the end connected to the Y-branch coupling region 529 can be terminated by reflector elements 532, 534, which can be implemented as Bragg reflectors. Multi-stripe laser 502 can be considered as having multiple linear laser cavities with one end of those cavities defined by reflectors 532 or 534 and the other end defined by reflectors 536 or 530. These multiple laser cavities are coupled together through the Y-branch region 529. Multi-stripe laser 502 also can be considered as having an extended linear laser cavity with two ends of the laser cavity defined by the two end reflectors 532 and with the other reflectors 534, 536 and 530 located within the laser cavity. Some of the light emitted from the waveguides in this laser cavity exit through the partially reflecting interfaces 530 and into the modulator stripes 541-543. Other light is retained in the laser cavity, being reflected by the reflector elements 532, 534 and 536 as well as by partial reflectors 530.

Partial reflectors 536 can help to define the laser cavity.

One end of the modulator optical stripes 541, 542, 543, faces the laser stripes 511, 512 and 513. The opposite end of each of the modulator stripes 541 and 542 is connected an optical waveguide combiner 562. The opposite end of modulator stripe 543 is connected to an input of optical waveguide coupler 565. The optical waveguide combiner 562 has two optical inputs and one optical output. The optical output of 562 is connected to one end of a waveguide segment 567 whose other end is connected to an optical waveguide splitter 566. The optical waveguide splitter 566 has one of its two outputs connected to a photodetector 508. The other output of optical waveguide splitter 566 is connected to another input of optical waveguide coupler 565. The two outputs of optical waveguide coupler 565 are then connected to one or more photodetectors 506 and 507. A portion of each modulator stripes 541, 542, 543 can be adjacent to one or more electrodes, 551, 552, 553, 554, 555 and 556. One or more modulation signals such as a voltage or current can be applied to these electrodes and can modulate the phase of light propagating through each of the modulator stripes 541, 542, 543. Each modulator stripe 541, 542, 543 is an optical waveguide comprising a material, such as an electro-optic material or a thermo-optic material, whose refractive index can be changed as a result of an applied change in electric-field or temperature. Also, a portion of optical waveguide segment 567 can be disposed adjacent to one or more electrodes 576, 577. A control signal such as a voltage or current can be applied to these electrodes and can adjust the relative phase shift of light in the optical waveguide segment 567. If electrodes 576, 577 are not utilized, then splitter 562 and combiner 566 may be embodied as a single coupler with two inputs and two outputs. But even if electrodes 576 and 577 are utilized, the result may still be a single coupler. The issue is whether the waveguide segment 567 supports a single optical mode (in the case of separate combiner, phase shifter and splitter) or supports two or more optical modes (in the case of a 2×2 coupler).

The basic modulator configuration illustrated by FIG. 5 can form the basis for many optical-domain filters for RF signals (see, for example, I. Gasulla, supra). The MI (formed from the first two stripes 541 and 542) produces upper and lower sidebands that are in-phase with each other. The phase modulator (embodied by the third stripe 543) produces upper and lower sidebands that have opposite phase from each other. Additional waveguide-based structures such as ring resonators (not shown) and MIs (not shown) may be located between the multi-stripe modulator 504 and the photodetectors 506 and 507 to produce additional filtering functions.

In one example, a baseband or IF signal is supplied to the first two modulator stripes 541 and 542. Various modulation formats can be obtained such as intensity modulation, I/Q modulation, single-sideband modulation, and QPSK or QAM depending on the specific signal waveforms applied to the electrodes of those two stripes, as discussed with reference to FIG. 4. A local oscillator waveform is supplied to the electrodes of the third modulator stripe (See A. Mast, C. Middleton, S. Meredith and R. DeSalvo, supra). This waveform is sufficiently strong to produce an optical phase-modulation spectrum that has not only the fundamental modulation sidebands but also higher-order modulation sidebands. Thus, the output of the third stripe 543 resembles a spectral comb. A tunable optical filter (not shown) can be located between this phase modulation stripe and the photodetectors to select a particular comb line to serve as the local oscillator for up-conversion of the signal produced by the MI.

For the embodiment of FIG. 5, three (stripes 511, 512 and 513) of the five laser stripes at the output end of the laser array 502 are coupled to three modulator stripes 541, 542 and 543 in modulator 504. The other two laser stripes 516 and 518 are terminated at that end by reflectors 536. Increasing the number reflector-terminated laser stripes in array 502 can increase the overall volume that provides laser gain in laser array 502. Higher laser gain also can be obtained by using longer stripes 521-526 in the portion of the Y-branching structure 529 that is opposite from the modulator 504.

Figure 6:
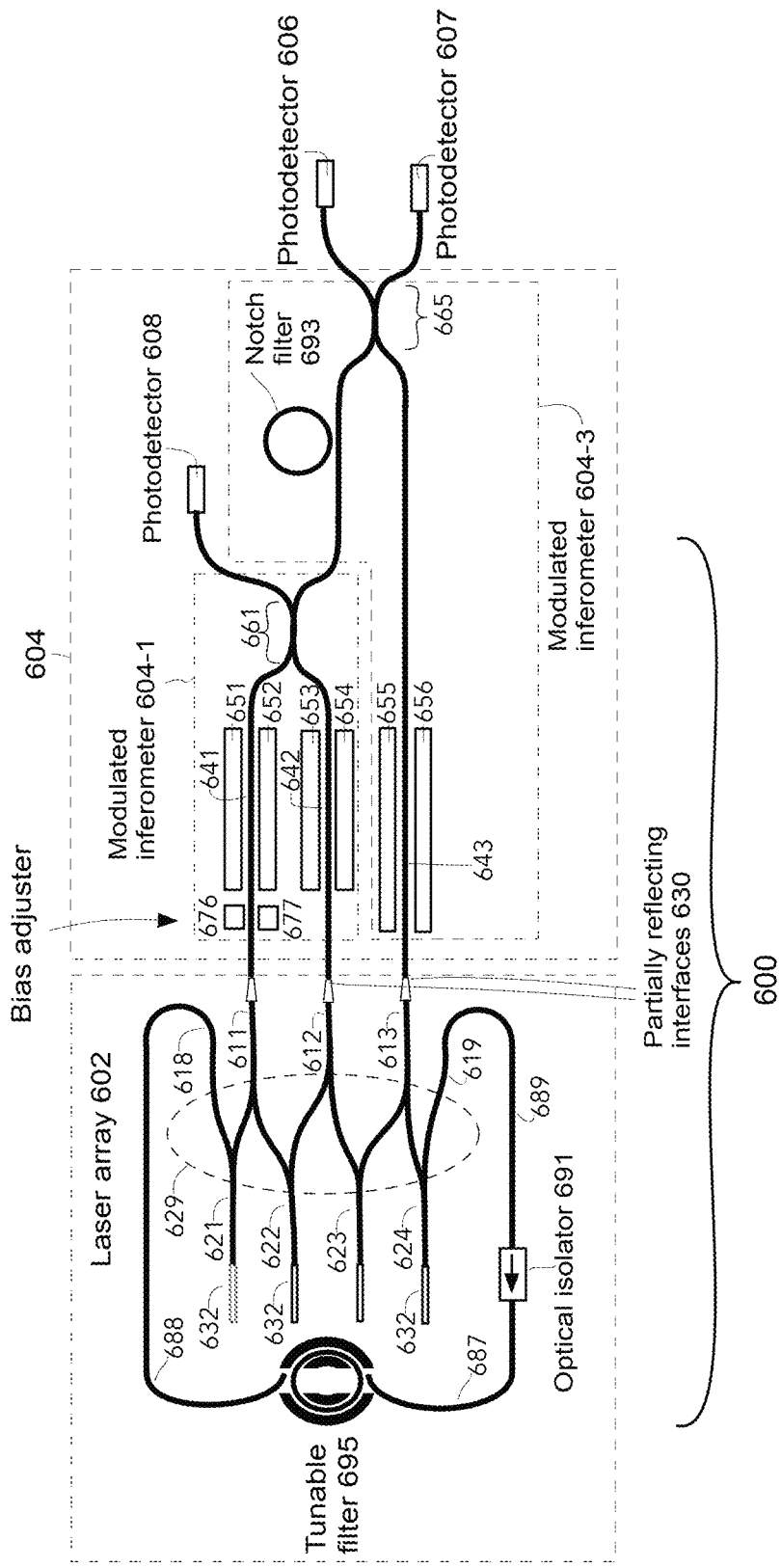
FIG. 6 depicts an embodiment of an integrated multi-stripe laser and multi-stripe modulator; laser has ring cavity and modulator has two nested interferometers.

Embodiment 4: Multiple Y-Junction Coupled and Loop Coupled Laser Stripes with Nested MZI Modulator Stripes Configured as Nested Modulated Interferometers FIG. 6 shows still another embodiment of a photonic source, labeled 600 in this embodiment, which comprises multi-stripe laser array 602 preferably integrated as a photonic circuit with a multi-stripe modulator 604. In this embodiment, the laser stripes are interconnected through a Y-branching structure 629 similar to the embodiment of FIG. 5. In the embodiment of FIG. 5, the laser has a Fabry-Perot cavity, with Bragg cavity reflectors defining one end of (and possibly both ends of) the optical resonator cavity. In the embodiment of FIG. 6, the cavity is defined by a ring cavity. Lasers with ring cavities can produce emission with narrow spectral linewidth, especially if some means, such as an optical isolator, is included to force the light to propagate in only one direction through the ring cavity. The embodiment of FIG. 6 is also depicted with one or more tunable filters that select a single spectral mode of the cavity.

In particular, FIG. 6 depicts a photonic source 600 comprising a multi-stripe laser array 602 and a multi-stripe modulator 604. The multi-stripe laser array 602 comprises laser stripes 611, 612 and 613. The multi-stripe laser array 602 further comprises laser stripes 618 and 619, with laser stripe 618 oriented parallel with and located next to laser stripe 611, and with laser stripe 619 oriented parallel with and located next to laser stripe 613. The multi-stripe laser 602 further comprises supplemental laser stripes 621, 622, 623 and 624. These supplemental laser stripes are connected to corresponding laser stripes 618, 611, 612, 613 and 619 through a Y-branch coupling region 629. Each laser stripe is an optical waveguide that has a light-emitting region. Light is emitted and propagates along the length of each laser stripe. Light also can be emitted along the optical waveguides in the Y-branch coupling region 629. The multi-strip modulator 604 comprises modulator stripes 641, 642 and 643. One end of laser stripes 611, 612 and 613 faces modulator stripes 641, 642 and 643 and is coupled to modulator stripes 641, 642 and 643 respectively, each through a partially reflecting interface 630. The opposite end of these laser stripes face the Y-branch coupling section 629. The ends of laser stripes 618 and 619 that do not interface with Y-branch coupling region 629 are connected via waveguide segments (such as waveguide segments 687, 688 and 689) to tunable optical filter 695 preferably via at least one direction-selective optical isolator 691.

The ends of the supplemental laser stripes 621, 622, 623 and 624 that are distal from the ends thereof connected to the Y-branch coupling region 629 can be terminated by reflector elements 632, which can be implemented as Bragg reflectors. Multi-stripe laser array 602 defines a ring laser cavity. The optical isolator 691 selects a preferred direction of travel for the laser light in the cavity, which is depicted as being clockwise in this embodiment of ring laser. Light in the laser stripes travel from laser stripe 618 to supplemental stripe 621 to laser stripe 611 to supplemental stripe 622 to laser stripe 612 to supplemental stripe 623 to laser stripe 613 to supplemental stripe 624 and to laser stripe 619. The waveguide segment 689, optical isolator 691, waveguide segment 687, tunable filter 695 and waveguide segment 688 form a feedback path for the laser cavity. Thus, the laser light from laser stripe 619 then travels to segment 689 and the light from segment 688 travels to laser stripe 618, thereby completing the ring path. Some of the light emitted from the waveguides in this laser cavity exit through the partially reflecting interfaces 630, which are disposed at an end of laser stripes 611, 612 and 613, where they mate with modulator stripes. Other light is retained in the laser cavity.

Unlike a typical ring-cavity laser, the laser shown in FIG. 6 has three output ports represented by the three partially reflecting interfaces 630 that couple the three laser stripes 611, 612 and 613 to the three stripes 641, 642 and 643 of the multi-stripe modulator 604. At the partially reflecting interface 630 between each laser stripe and its corresponding modulator stripe, a portion of the laser light is output from the laser 602 into the modulator 604 and another portion of the laser light is reflected to remain in the laser 602.

Portions of the stripes (optical waveguides) inside the laser cavity of the laser array contain light-emitting material suitable for lasing and portions of stripes (optical waveguides) inside the MIs contain electro-optic or thermo-optic material suitable for a modulator stripe. However, portions of the stripes (optical waveguides) outside of the laser cavity and outside of MIs need not contain either light-emitting material suitable for a laser stripe or contain electro-optic or thermo-optic material suitable for a modulator stripe. This is true for all embodiments disclosed herein.

One end of the modulator stripes 641, 642, 643, faces the laser stripes 611, 612, 613, respectively at partially reflecting interfaces 630. The opposite end of each of the modulator stripes 641 and 642 is connected an input of optical waveguide coupler 661. Optical waveguide coupler 661 has two optical inputs and two optical outputs. One optical output of optical waveguide coupler 661 is connected to an optical input of optical waveguide coupler 665 through notch filter 693. Optical waveguide coupler 665 has two optical inputs and two optical outputs. The opposite end of modulator stripe 643 is connected the other input of optical waveguide coupler 665. The other output of optical waveguide coupler 661 is connected to a photodetector 608. The two outputs of optical waveguide coupler 665 are connected to one or more photodetectors 606 and 607. A portion of each modulator stripe 641, 642, 643 may be adjacent to one or more electrodes, 651, 652, 653, 654, 655 and 656. One or more modulation signals such as a voltage or current can be applied to these electrodes and can modulate the phase of light propagating through each of the modulator stripes. Each modulator stripe is an optical waveguide comprising a material, such as an electro-optic material or a thermo-optic material, whose refractive index can be changed as a result of an applied change in electric-field or temperature. Also, a portion of optical modulator stripe 641 and/or optical modulator stripe 642 can be adjacent to one or more "bias adjuster" electrodes 676, 677. A control signal such as a voltage or current can be applied to these electrodes and can adjust the relative phase shift of light in the optical waveguide segment The multi-stripe modulator 604 of this embodiment has three modulator stripes 641, 642, and 643. The first two modulator stripes are part of a first modulated interferometer (MI) 604-1. The output of this first MI is combined with the third modulator stripe (643) to form another Modulated Interferometer MI 604-3. The relative phases of the first two modulator stripes can be set with the bias adjuster electrodes 676. 677 for a phase difference of n radians. This null-biasing of the first MI 604-1 minimizes the light at the laser frequency that is coupled to the second MI 604-3. An output of the photodetector 608 can be monitored to obtain a desired bias point. The notch filter 693 may be utilized to attenuate the light at the laser frequency, thereby resulting in a double sideband or a single sideband output, depending on the drive signals applied to the first MI 604-1. The phase shifter in the third modulator stripe 643 adjusts the relative phase difference for the light in the other MI 604-3. This other MI 604-3 re-inserts an amount of light at the laser frequency for the light coupled to photodetector 606. The light from the third modulator stripe that is not coupled to photodetector 606 is coupled instead to photodetector 607.

A possible application of this embodiment of a multi-stripe modulator is as a source of both a RF signal and its second harmonic. This three-stripe nested modulated interferometer 604 formed by MIs 604-1 and 604-3 has an advantage over a conventional two-stripe MI. For a two-stripe MI, the amount of light at the laser frequency (the optical carrier) varies as the strength of the RF drive to the electrodes is varied. However, with the three-stripe MI, that amount of light at the laser frequency is independent of the strength of that RF drive, such as supplied to the electrodes 651-654 of modulator stripes 641, 642. As a result, the ratio of power levels for the generated fundamental and second-harmonic outputs from photodetector 606 and from photodetector 607 can be controlled more easily.

Figure 7:
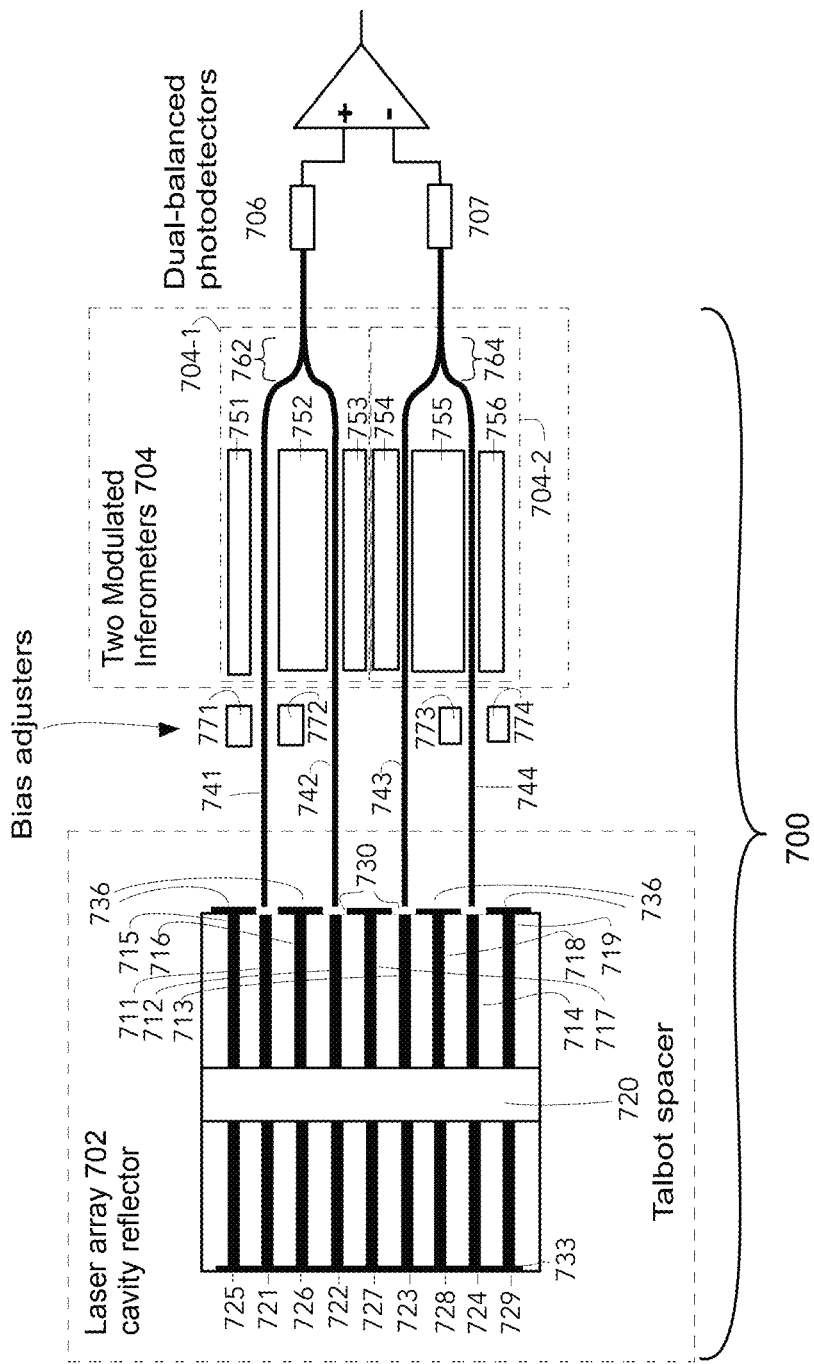
FIG. 7 depicts an embodiment integrated multi-stripe laser and multi-stripe modulator; laser stripes are leaky-wave coupled and the modulator has two modulated interferometers, each with an adjustable bias setting.

Embodiment 5: Multiple Leaky-Wave Coupled Laser Stripes with Dual Parallel MZI Modulator Stripes FIG. 7 shows another embodiment of a photonic source, labeled 700 in this embodiment, which comprises a multi-stripe laser array 702 integrated with a multi-stripe modulator 704. As will be explained, the laser stripes of array 702 may be implemented with leaky waveguides. FIG. 7 depicts the photonic source 700 as including a multi-stripe laser array 702 and a multi-stripe modulator 704. The multi-stripe laser array 702 comprises laser stripes 711, 712, 713 and 714. The multi-stripe laser 702 further comprises laser stripes 715, 716, 717, 718 and 719. Each laser stripe is an optical waveguide that has a light-emitting region. Light is emitted and propagates along the length of each laser stripe. The multi-stripe laser 702 preferably further comprises supplemental laser stripes 721, 722, 723, and 724 as well as additional supplemental laser stripes 725, 726, 727, 728 and 729. The multi-stripe laser 702 further comprises a diffraction coupling section 720 that is located between laser stripes 711-719 and supplemental laser stripes 721-729. The multi-stripe modulator 704 comprises modulator stripes 741, 742, 743 and 744. One end of laser stripes 711, 712, 713 and 714 faces modulator stripes 741, 742, 743 and 744. The opposite end of these laser stripes face the diffraction section 720. One end of laser stripes 715, 716, 717, 718 and 719 faces the multi-stripe modulator 704, with those ends each terminating in a cavity reflector of cavity reflectors 736, which may be implemented as Bragg reflectors, if desired.

The ends of laser stripes 711-719 that do not face and optically connect with the modulator stripes 741, 742, 743 and 744 face the diffraction section 720. Diffraction coupling section 720 also can be considered as a Talbot spacer whose length in the direction parallel to the laser stripes is set according to a Talbot distance. One end of each supplemental laser stripe 721-729 also faces the diffraction section 720 and thus also faces the laser stripes 711-719. The opposite end of each supplemental laser stripe 721-729 preferably terminates at a reflective surface 733. The opposite end of each supplement laser stripe also can alternatively terminate at a Bragg reflector (not shown for this embodiment). One also can consider the multi-stripe laser 702 as having a single inclusive laser cavity whose two ends are defined by the reflectors 736 and by reflective surface 733. Emitted light from the various laser stripes 711-719 and from the various supplemental laser stripes 721-729 are coupled to each other through the diffraction section 720. In some examples of the multi-stripe laser 702, the length of the diffraction coupling section 720 is set equal to an odd multiple or an even multiple of one-half the Talbot distance. The number of various supplemental laser stripes utilized in laser array 702 may be modified as a user of this technology deems appropriate.

One end of the modulator stripes 741, 742, 743, 744, faces and optically connects with laser stripes of laser array 702. The opposite end of each of the modulator stripes is connected to an optical waveguide combiner 762, 764. Each optical waveguide combiner 762, 764 has two optical inputs and one optical output. The optical output of each combiner 762, 764 is connected to a photodetector 706, 707. These photodetectors 706 and 707 can be configured as a dual-balanced pair, as depicted. A portion of each modulator stripe 741, 742, 743, 744 can be disposed adjacent to one or more electrodes, 751, 752, 753, 754, 755 and 756. One or more modulation signals such as a voltage or current can be applied to these electrodes and can modulate the phase of light propagating through each of the modulator stripes. Each modulator stripe 741, 742, 743, 744 is an optical waveguide comprising a material, such as an electro-optic material or a thermo-optic material, whose refractive index can be changed as a result of an applied change in electric-field or temperature.

As depicted in FIG. 7, modulator stripes 741 and 742 and optical waveguide combiner 762 form a first MI 704-1. Modulator stripes 743 and 744 and optical waveguide combiner 764 form a second MI 704-2. One or more of the optical modulator stripes 741, 742, 743, 744 also can be disposed adjacent to one or more "bias adjuster" electrodes 771, 772, 773, 774. One or more control signals such as a voltage or current can be applied to these electrodes and can adjust the relative phase shift of light in the two modulator stripes of a MI. The control signals applied to "bias adjuster" electrodes 771, 772, 773, 774 can adjust the relative phase shift of light in these modulator stripes and thereby adjust bias points of the two MIs. For example, control signals applied to "bias adjuster" electrodes 771 and 772 can adjust the bias point of the first MI 704-1. Similarly, control signals applied to "bias adjuster" electrodes 773 and 773 can adjust the bias point of the second MI 704-2. Typical bias points for MZI modulators such as first and second MZIs 704-1, 704-2 include "quadrature bias", "low bias" and "null bias".

With reference to the embodiment of FIG. 7, the multiple laser stripes in this laser are coupled throughout the length of those stripes, unlike the multiple stripes in the lasers of the preceding examples. For this laser, the regions between adjacent stripes preferably have a higher refractive index than the regions of the laser stripes, as illustrated by the cross-sectional drawings shown at the top of FIG. 8a and at the top of FIG. 8b. The location of the light in the laser stripes is indicated by the ellipses shown in the illustration at the top of FIG. 8a. The location of the light in the laser stripes is indicated by the peaks in the curve shown in the illustration at the top of FIG. 8b. Since the regions between adjacent stripes have a higher refractive index than the regions of the laser stripes (where the laser light is generated and is mainly located), the light in each laser stripe is drawn into the regions between the stripes. Such "leaky wave" coupling among the stripes of this laser is very strong and enables the laser to remain phase locked at very high drive levels, far above threshold (see J. D. Kirch, et al., "5.5 W near-diffraction-limited power from resonant leaky-wave coupled phase-locked arrays of quantum cascade lasers,"

Figure 8A:
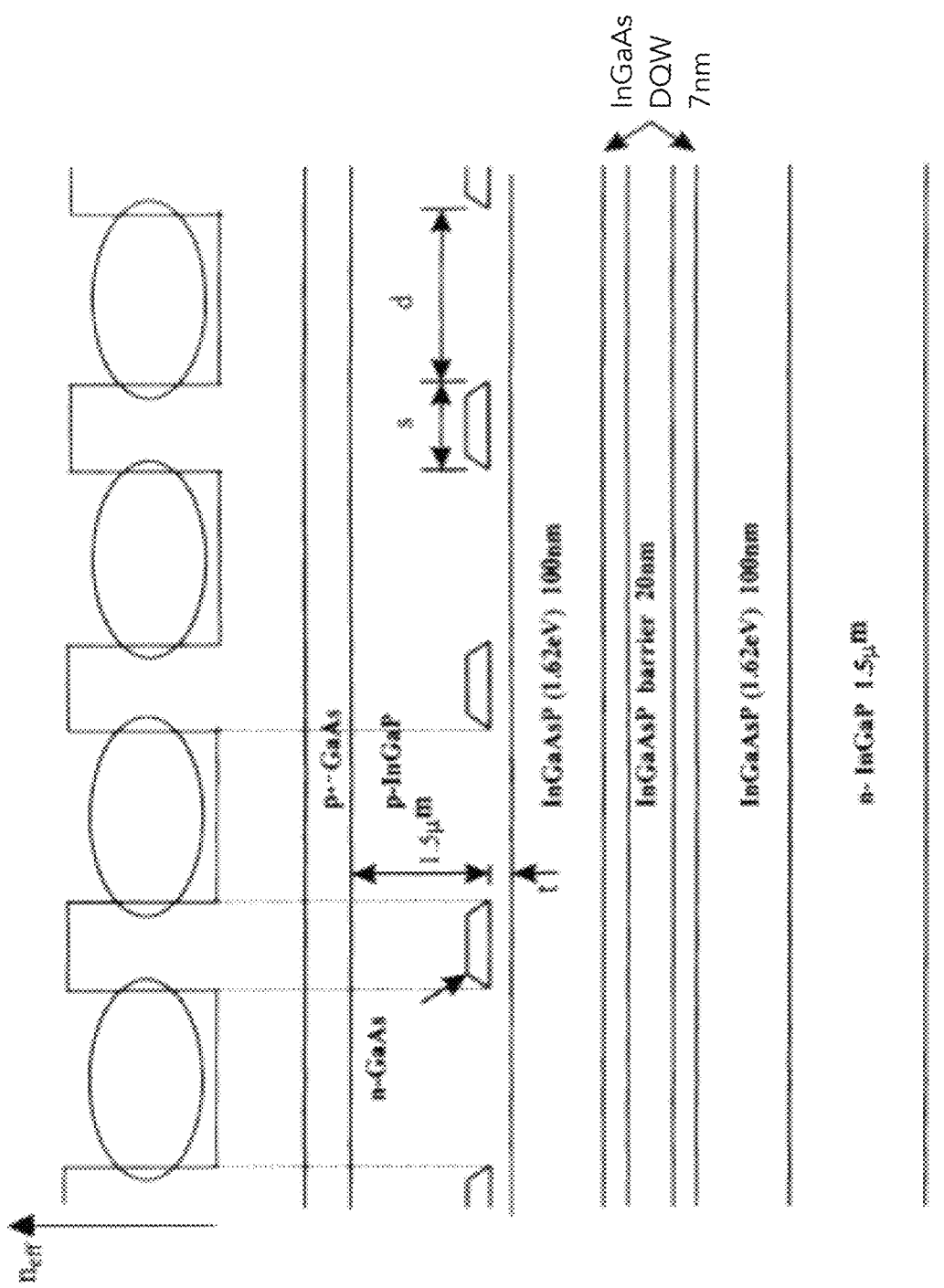
FIGS. 8a and 8b depict examples of prior art leaky-wave coupled multi-stripe lasers.
Figure 8B:
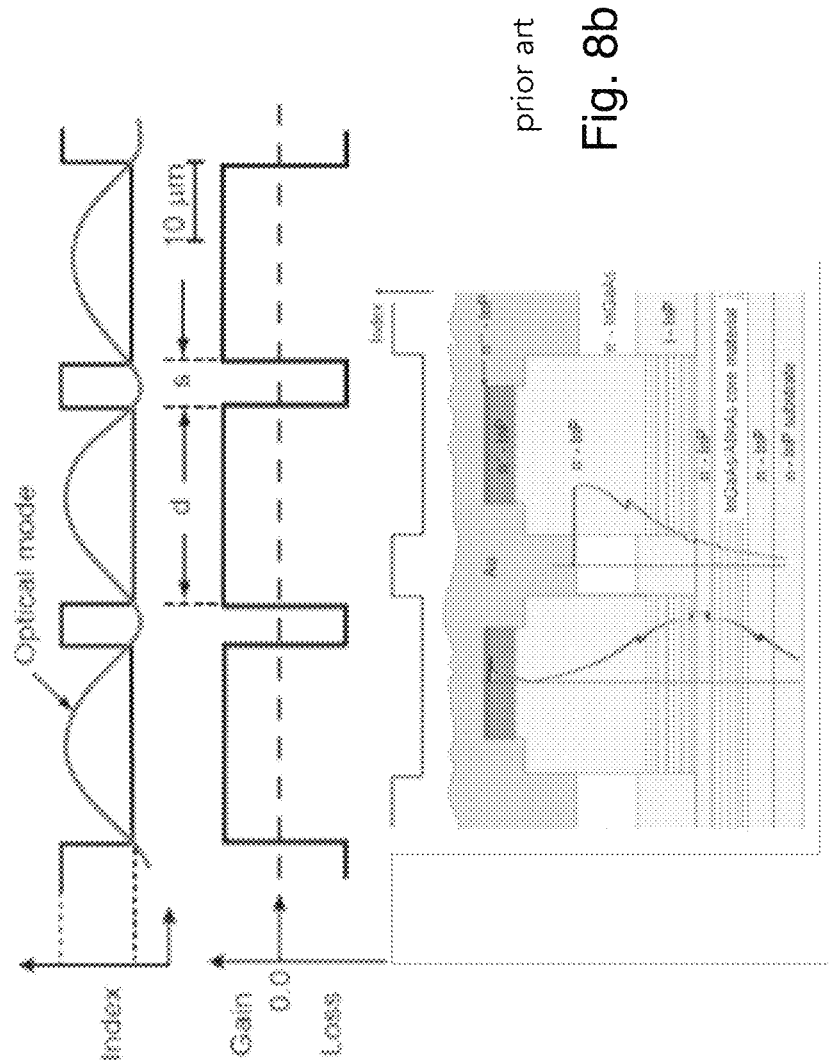

*Applied Physics Letters*, v. 106, p. 061113 (2015), the disclosure of which is hereby incorporated herein by reference). To keep the laser stripes from forming in the high-index regions, those regions also have high absorption loss of the light, as depicted in FIGS. 8a and 8b. As illustrated in the cross-sectional structure depicted at the bottom of FIG. 8a, the absorption is produced by narrow-bandgap semiconductor regions (the trapezoidal shaped features . . . See H. Yang, et al., "1.6 W CW coherent power from large-index-step (Δn=0.1) antiguided laser arrays," *Proceedings SPIE* Volume 3628, p. 228 (1999), the disclosure of which is hereby incorporated herein by reference). In the structure of FIG. 8b, the absorption is produced by metal regions that extend close to the laser active layer (See, J. D. Kirch, et al., supra).

With leaky-wave coupled multi-stripe lasers, as well as with lasers coupled via diffraction coupling sections, special approaches are typically used to cause the lasers to operate with the adjacent stripes in-phase rather than 180-degrees out of phase from each other. The laser has two sets of stripes that are separated by a Talbot spacer, which is a diffraction coupling section of a specific length. For prior leaky-wave coupled lasers with Talbot spacers, the stripes on one side of the Talbot spacer are offset laterally by one-half of a stripe spacing compared to the stripes on the other side of the Talbot spacer, whose length is set to one-half the Talbot distance (See C. Zmudzinski, D. Botez, L. J. Mawst and C. Tu, "Coherent, one watt CW operation of large aperture resonant arrays of antiguides," *Proceedings SPIE* Volume 1850, p. 13 (1993), the disclosure of which is hereby incorporated herein by reference). However, for the embodiment of FIG. 7, every other laser stripe is coupled to a modulator stripe. Thus, even if adjacent laser stripes are exactly out-of-phase, those laser stripes that are coupled to modulator stripes are in-phase. For the laser of FIG. 7, the length of the Talbot spacer is one-half the Talbot distance (See J. Z. Wilcox, et al., "Design considerations for diffraction coupled arrays with monolithically integrated self-imaging cavities," *Applied Physics Letters*, v. 54, n. 19, p. 1848 (1989), the disclosure of which is hereby incorporated herein by reference). Those laser stripes that are not connected to modulator stripes have reflecting mirrors located at the end facing the modulator. The opposite end of all the laser stripes have reflecting mirrors. Thus, the only light exiting from the stripes of this laser is the light coupled into the modulator stripes. Note that a reflecting surface or mirror may be implemented as a Bragg grating or Bragg reflector.

The separate modulator stripes 741, 742, 743, 744 of the multi-stripe modulator 704 of this embodiment are preferably coupled to separate laser stripes 711, 712, 713 and 714 through minimally reflecting interfaces 730. This multi-stripe modulator comprises two separate modulated interferometers 704-1 and 704-2, each with two modulator stripes, whose outputs are coupled to the two photodetectors 706, 707 preferably arranged as a dual-balanced differential pair. As a result, common-mode output from the two MIs 704-1 and 704-2 is suppressed. In one application, the two MIs 704-1 and 704-2 are driven by the same RF input signal (see W. K. Burns, G. K. Gopalakrishnan and R. P. Moeller, "Multi-octave operation of low-biased modulators by balanced detection," *IEEE Photonics Technology Letters*, v. 8, n. 1, p. 130 (1996), the disclosure of which is hereby incorporated herein by reference). The two MIs may be set to different "low-bias" points that are at opposite sides of the "null bias" point. Thus, an increase in the drive voltage will cause the optical output from the first MI 704-1 to increase but cause the optical output from the second MI 704-2 to decrease. Operating at the "low-bias" point minimizes the noise associated with the optical carrier (at the laser frequency) without greatly reducing the fundamental modulation component. However, it increases the even-order distortion. The choice of the two bias settings causes the even-order distortion to be common-mode and thus be rejected by the differential photodetection. The fundamental modulated outputs from the two MIs 704-1 and 704-2 are opposite from each other and thus are summed by the differential photodetection. The minimally reflecting interfaces 730 may be less reflective than the partially reflecting interfaces of prior embodiments since coupling occurs between laser stripes along the length of the laser stripe, there does not need to be much reflection at ends of the laser stripes whose output ends are coupled to modulator stripes.

Figure 9:
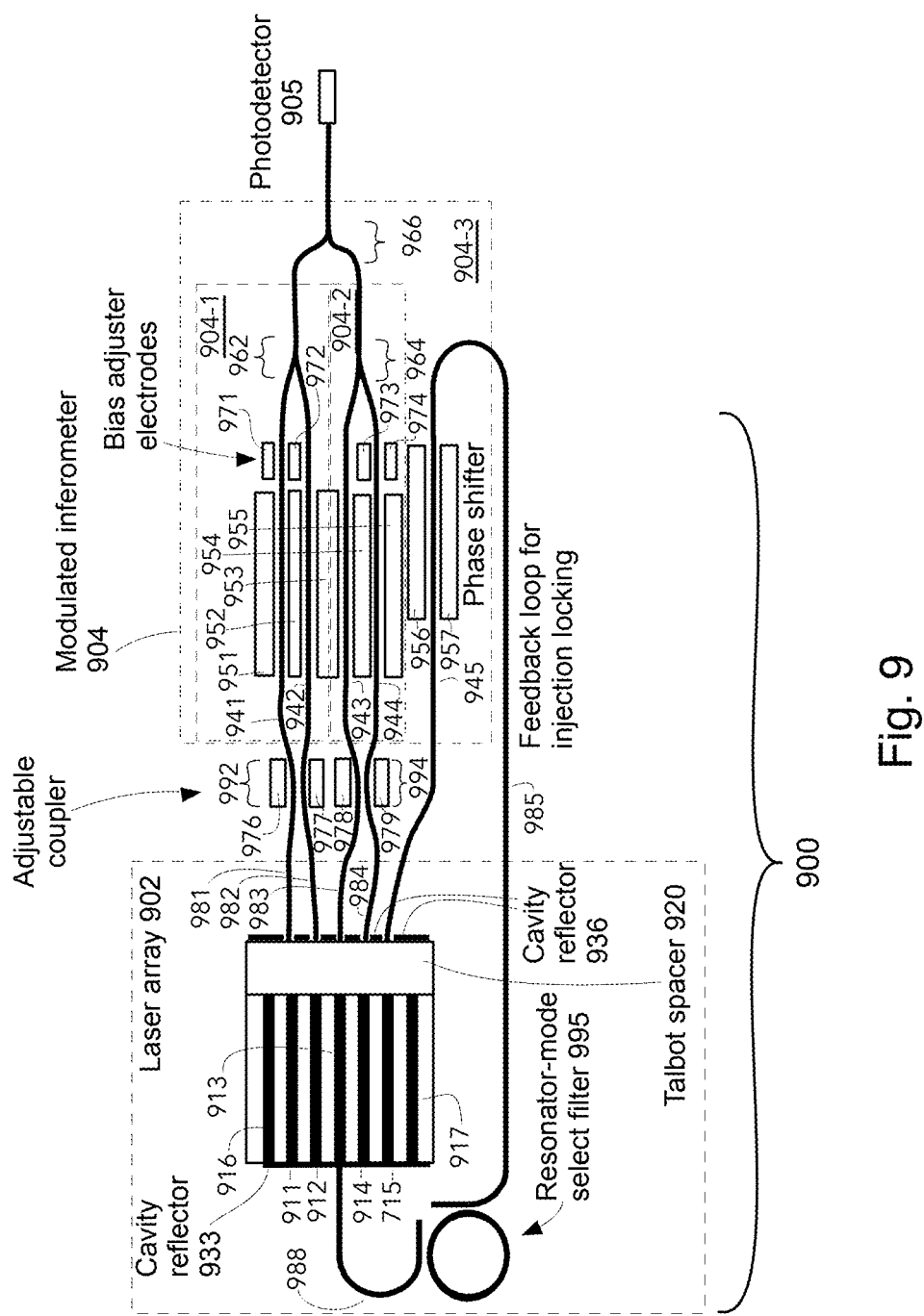
FIG. 9 depicts an embodiment of an integrated multi-stripe laser and multi-stripe modulator; laser stripes are leaky-wave coupled, modulator stripes form a modulated interferometer comprising two other modulated interferometers.

Embodiment 6: Multiple Leaky-Wave Coupled and Loop Coupled Laser Stripes with Nested MZI Modulator Stripes FIG. 9 shows another embodiment of a photonic source, labeled 900 in this embodiment, which comprises a multi-stripe laser array 902 and a multi-stripe modulator 904 preferably integrated together as a photonic circuit. Similar to the laser array of the embodiment in FIG. 7, the stripes of this laser are leaky-wave coupled and can have a structure such as the ones depicted in FIG. 8a and/or 8b which are from H. Yang, et al, supra and J. D. Kirch, et al., supra. For the embodiment of FIG. 9, a Talbot spacer region (or diffraction coupling section) 920 is located between the laser stripes and the modulator stripes. The laser cavity is defined in part by cavity reflectors 933 located on the end of the laser stripes opposite from the end with the modulator stripes. Additional cavity reflectors 936 are located on the edge of the Talbot spacer region 920 facing the modulator stripes and are located between where the multiple optical waveguides of the multiple modulator stripes contact the Talbot spacer 920. The length of the Talbot spacer is preferably chosen to be one-half the Talbot distance. At this Talbot distance, a spatial double image of the multi-stripe emission pattern is formed, with the image having twice as many spots of light as there are lasing stripes. The lateral placement of these additional cavity reflectors 936 is half-way between successive laser stripes, and is aligned with every other imaged spot, as illustrated in FIG. 3b. In-phase lasing of the multiple laser stripes is achieved for this offset pattern of the additional cavity reflectors (See J. Thomas, J. R. Leger, G. J. Swanson and M. Holz, "Coherent addition of laser arrays using binary-optics," *IEEE LEOS Summer Topical Meeting on New Semiconductor Laser Devices and Applications*, paper SCTh4 (1990), the disclosure of which is hereby incorporated herein by reference). Light from the laser stripes is coupled into the modulator stripes, with one end of the modulator stripes aligned with the space between the additional cavity reflectors 936 and in-line with the laser stripes (i.e., with the other set of imaged spots). The light coupled into the multiple modulator stripes is in-phase with each other, but is out-of-phase with the light reflected from the additional cavity reflectors. The interfaces between the Talbot spacer region and the waveguides of the multi-stripe modulator preferably have minimal reflection.

In particular, FIG. 9 depicts a photonic source 900 comprising a multi-stripe laser array 902 and a multi-stripe modulator 904. The multi-stripe laser 902 comprises laser stripes 911, 912, 913, 914 and 915. The multi-stripe laser 902 further comprises laser stripes 916 and 917. Each laser stripe is an optical waveguide that has a light-emitting region. Light is emitted and propagates along the length of each laser stripe. The multi-stripe laser array 902 further comprises a diffraction coupling section 920 that is located between laser stripes 911-917 and the multi-stripe modulator 904. The multi-stripe modulator 904 comprises modulator stripes 941, 942, 943 and 944 as well as modulator stripe 945. One end of laser stripes 911-917 faces towards modulator stripes 941-945. This same end of laser stripes 911-917 also faces the diffraction section 920. The opposite end of the laser stripes 911, 912, 914, 915, 916 and 917 terminate at one or more cavity reflectors 933.

One end of the diffraction section 920 faces and is connected to the laser stripes 911-917. A portion of the opposite end of the diffraction section is connected to optical waveguide segments 941-945 of the multi-stripe modulator 904 via, as needed, waveguide segments 981, 982, 983, and 984. Another portion of the opposite end of the diffraction section 920 terminates at one or more cavity reflectors 936. The cavity reflectors 933 and cavity reflectors 936 may comprise one or more surfaces coated with a material, such as a metal such as titanium, platinum, silver or gold, that increases its reflectance of the emitted light. The cavity reflectors 933 and cavity reflectors 936 also may be implemented as Bragg reflectors.

In the embodiment of FIG. 9, one of the modulator stripes (945) is used as a phase shifter in a feedback loop that couples a portion of the laser light back to the opposite end of the leaky-wave coupled multi-stripe laser structure. This feedback loop also can have an optical filter 995 that selects one spectral mode (or longitudinal mode) of the laser to be coupled back. The feedback light is coupled into one stripe (913) of the multi-stripe laser array 902. However, since the lateral coupling between the multiple laser stripes is so strong for this leaky-wave coupled device, that injected light is effectively coupled to all of the laser stripes (see M. Jansen, et al., "Injection locking of antiguided resonant optical waveguide (ROW) arrays," *Proceedings SPIE* Volume 1634, p. 21 (1992), the disclosure of which is hereby incorporated herein by reference). This injection locking scheme is useful for maintaining the spectral and spatial properties of the laser output as the laser output power is increased to high levels.

In the embodiment of FIG. 9, four other modulator stripes are used to form a pair of modulated interferometers (MI) 904-1 and 904-2 whose outputs are combined in another modulated interferometer 904-3, with all three modulated interferometers comprising a nested modulated interferometer 904. The output of this outer MI 904-3, which is the output of combiner 966, is connected to a photodetector 905. This modulator device can provide an input-drive to output-signal transfer function that has enhanced linearity. Instead of having a typical transfer function for the intensity of its output light proportional to sin ($\pi$), the transfer function of this device is proportional to (0.84 sin ($\pi$)–0.16 sin ($2\pi$)), with $\pi$ and $2\pi$ being the phase modulation of the modulator stripes (See Y. Yamaguchi, et al., "Linearized LiNbO3 modulator with dual Mach-Zehnder interferometer and branched asymmetric CPW electrode," *Proceedings 43$^{rd}$ European Conference on Optical Communication (ECOC)* 2017 (published by IEEE), the disclosure of which is hereby incorporated herein by reference). Two modulator stripes (941 and 942) form a first MI and two other modulator stripes (943 and 944) form a second MI. An adjustable optical coupler or light redistributor 992 precedes the first MI and divides the light into the two modulator stripes of that first MI according to a ratio of 0.84/0.16. Another adjustable optical coupler or light redistributor 994 precedes the second MI and divides the light into the two modulator stripes of that second MI according to a ratio of 0.16/0.84. The phase modulation applied to the two stripes of a given MI is different by a factor of two, by appropriately adjusting the placement of the electrodes 951-955. Also, the bias points of the two MIs are adjusted (by electrodes 971-974) to produce a net cancellation of odd-order distortion products.

In particular, with regard to the photonic source 900 depicted in FIG. 9, optical waveguide segments 981 and 982 connect to modulator stripes 941 and 942 through optical waveguide coupler 992. Also, optical waveguide segments 983 and 984 connect to modulator stripes 943 and 944 through optical waveguide coupler 994. The ends of modulator stripes 941 and 942 opposite from their waveguide coupler 992 are connected to optical waveguide combiner 962. Also, the ends of modulator stripes 943 and 944 opposite from their optical waveguide coupler 994 are connected to optical waveguide combiner 964. Each of these optical waveguide combiners 962 and 964 have two optical inputs and one optical output. Optical waveguide combiner 966 also has two optical inputs and one optical output. The outputs from combiners 962 and 964 are connected to the two inputs of optical waveguide combiner 966. The output of combiner 966 is connected to a photodetector 905.

One end of modulator stripe 945 of multi-stripe modulator 904 connects to the end of diffraction-coupling section 920 opposite from the laser stripes 902. The other end of modulator stripe 945 is connected to optical waveguide segment 985 that then connects to laser stripe 913 through optical filter 995 and optical waveguide segment 988. Optical waveguide segments 985 and 988 as well as modulator stripe 945 and optical filter 995 can form a feedback loop for injection locking of the multi-stripe laser 902.

A portion of each modulator stripe 941, 942, 943, 944 may be disposed adjacent to one or more electrodes, 951, 952, 953, 954 and 955. A modulation signal such as a voltage or current can be applied to these electrodes and can modulate the phase of light propagating through each of the modulator stripes. Also, a portion of modulator stripe 945 may be disposed adjacent to electrodes 956, 957. A signal such as a voltage or current can be applied to these electrodes and can modulate or control the phase of light propagating through this modulator stripe. Each modulator stripe is an optical waveguide comprising a material, such as an electro-optic material or a thermo-optic material, whose refractive index can be changed as a result of an applied change in electric-field or temperature. One or more of the optical modulator stripes 941, 942, 943, 944 also may be disposed adjacent to one or more "bias adjuster" electrodes 971, 972, 973, 974. Control signals such as a voltage or current can be applied to these electrodes and can adjust the relative phase shift of light in the modulator stripes. Control signals also can be applied to electrode sets 976 & 977 and 978 & 979 disposed adjacent to optical waveguide couplers 992 and 994. These control signals can adjust the relative amplitudes of the light supplied to the two outputs of each optical waveguide coupler. For example, a control signal applied to electrode set 976 & 977 adjacent to optical waveguide coupler 992 can adjust the relative amplitudes of the light supplied to modulator stripes 941 and 942.

Figure 10:
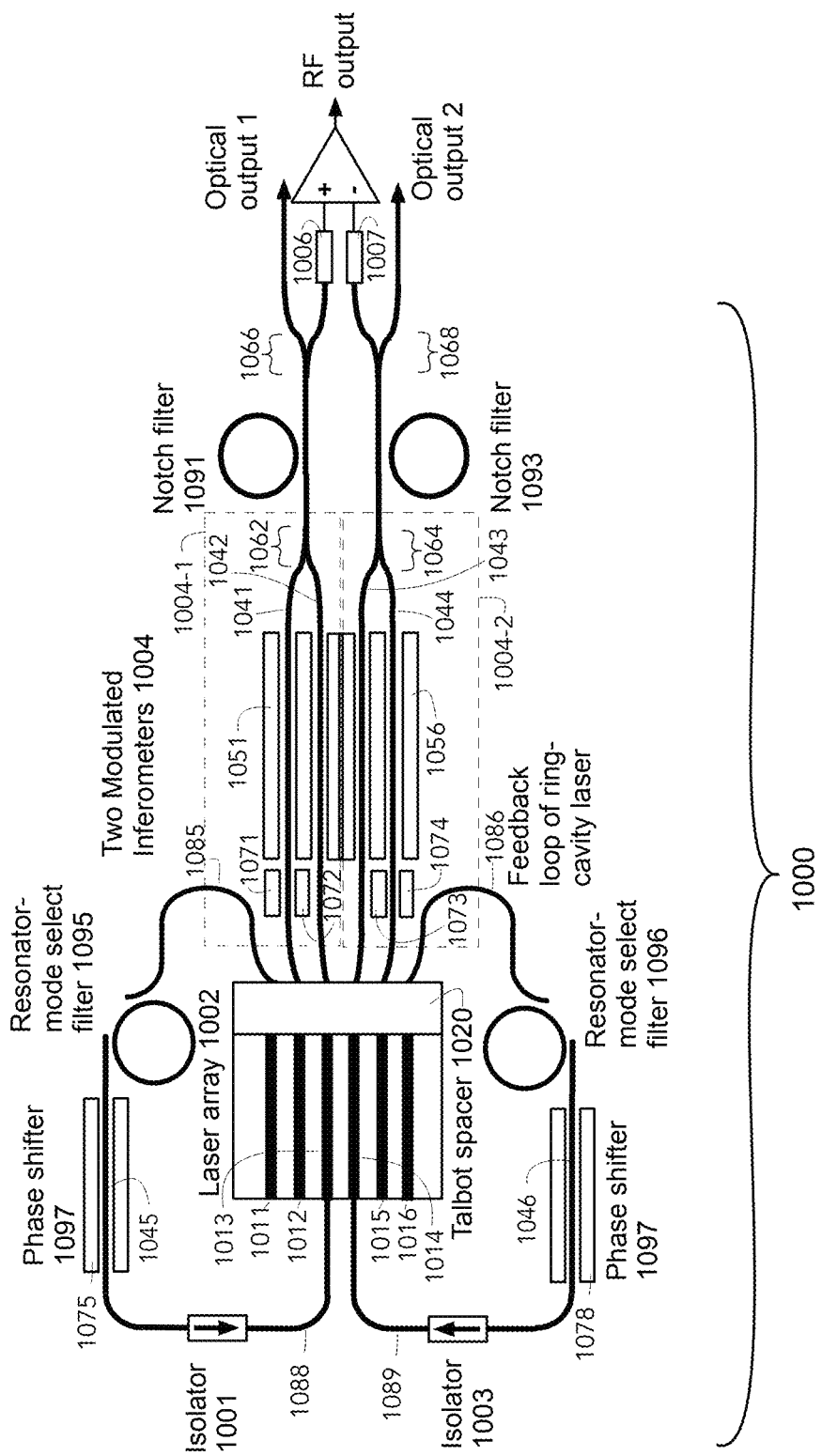
FIG. 10 depicts an embodiment of an integrated multi-stripe laser and multi-stripe modulator; laser has a dual-ring cavity, some of the modulator stripes are part of the laser cavity.

Embodiment 7: Multi-Stripe, Leaky-Wave Coupled Ring-Cavity Laser with Dual Mach-Zehnder Modulators FIG. 10 shows another embodiment of a photonic source, labeled 1000 in this embodiment, which comprises an integrated multi-stripe laser array 1002 and multi-stripe modulator 1004. For this embodiment, the multiple stripes of the laser may be preferably leaky-wave coupled. Strong coupling between the strips occurs along the entire length of the stripes. At the end of the laser facing the modulator, the multiple laser stripes couple into a diffraction coupling section or Talbot-spacer section. The length of this Talbot spacer is a full Talbot distance. Thus, the array of emitted spots is re-imaged at the output end of the Talbot spacer. The re-imaged spots are in-line with the emitted spots. One end of the multiple stripes of the modulator is aligned with the re-imaged spots of light from the laser, to maximize the coupling of laser light into those modulator stripes.

The laser 1002 of this embodiment has a ring cavity structure with the laser light traveling in only one direction around the ring cavity. The ring cavity of this laser array 1002 of this embodiment has two feedback loops. The strong leaky-wave coupling enables the laser to operate as a single device even though it has two feedback loops. Optical isolators in each of the two feedback loops establish the direction of travel for the laser light. In this example, two of the six modulator stripes 1045 and 1046 are part of the two feedback loops. These two modulator stripes 1045, 1046 can implement one or more adjustable phase shifters 1097. The phase shifter(s) preferably ensures that the interaction between the light fed back from the two loops is constructive (in-phase) rather than destructive. One or more of the feedback loops also can include a spectral filter 1095, 1096 that selects a particular cavity-mode (laser frequency) to feed back. If the two feedback loops have spectral filters whose free-spectral ranges are slightly different from each other, the combination of two feedback loops can produce a Vernier-effect spectral filtering that provides even greater frequency selectivity of the laser light.

In particular, FIG. 10 depicts a photonic source 1000 comprising a multi-stripe laser 1002 and a multi-stripe modulator 1004. The multi-stripe laser 1002 comprises six laser stripes 1011-1016. Each laser stripe is an optical waveguide that has a light-emitting region. Light is emitted and propagates along the length of each laser stripe. The multi-stripe laser 1002 further comprises a diffraction coupling section 1020 that is located between laser stripes 1011-1016 and the multi-stripe modulator 1004. The multi-stripe modulator 1004 comprises modulator stripes 1041-1046. One end of laser stripes 1011-1016 faces modulator stripes 1041-1046. This same end of laser stripes 1011-1016 also faces the diffraction section 1020. The opposite end of the laser stripes 1011-1016 preferably do not terminate at a cavity reflector. Instead, the opposite end of one or more of the lasers stripes 1011-1016 is connected to optical waveguide segments 1088, 1089.

One end of the diffraction section 1020 faces and is connected to the laser stripes 1011-1016. A portion of the opposite end of the diffraction section is connected to modulator stripes 1041-1044 of the multi-stripe modulator 1004. One end of each of modulators stripes 1041-1044 faces and is connected to diffraction section 1020. The opposite end of modulator stripes 1041 and 1042 is connected to the two inputs of optical waveguide combiner 1062. Similarly, the opposite end of modulator stripes 1043 and 1044 is connected to the two inputs of optical waveguide combiner 1064. Optical waveguide combiners 1062 and 1064 each have two optical inputs and one optical output. The optical output of combiner 1062 connects via a waveguide and a notch filter 1091 to a splitter 1066. The optical output of combiner 1064 connects via a waveguide and a notch filter 1093 to a splitter 1068. Optical splitters 1066 and 1068 have one optical input and two optical outputs. One output of splitter 1066 connects to photodetector 1006. Also, one output of splitter 1068 connects to photodetector 1007. These two photodetectors may be configured as a dual-balanced pair. The other output of splitter 1066 provides Optical output 1 of the photonic source 1000. Similarly, the other output of splitter 1068 provided Optical output 2 of the photonic source 1000.

Modulator stripes 1045 and 1046 form part of the laser ring cavity of multi-stripe laser array 1002. One end of the diffraction section 1020 faces and is connected to the laser stripes 1011-1016. A portion of the opposite end of the diffraction section is connected to modulator stripes 1045 and 1046 of the multi-stripe modulator 1004 through optical waveguide segments 1085 and 1086. Optical waveguide segment 1085 connects to one end of modulator stripe 1045 through optical filter 1095. The opposite end of modulator stripe 1045 connects to a laser stripe 1011-1016 through an optical isolator 1001 and optical waveguide segment 1088. Likewise, optical waveguide segment 1086 connects to one end of modulator stripe 1046 through optical filter 1096. The opposite end of modulator stripe 1046 connects to a laser stripe 1011-1016 through an optical isolator 1003 and optical waveguide segment 1089. In this example, the additional two modulator stripes 1045 and 1046 are part of the two feedback loops. These two modulator stripes function as phase shifters that can adjust the optical phases of the feedback light for the laser. FIG. 10 depicts mode-select filters 1095, 1096 as being located between modulator stripes 1045, 1046 and the end of diffraction-coupling section 1020 facing the modulator stripes 1041-1044. However, one or both of the modulator stripes 1045, 1046 could be located, instead, between the mode-select filters 1095, 1096 and the end of diffraction-coupling section 1020 facing the modulator stripes 1041-1044, similar to the configuration depicted in FIG. 9 for modulator stripe 945 and mode-select filter 995.

A portion of each modulator stripe 1041, 1042, 1043, 1044 may be disposed adjacent to one or more electrodes 1051-1056 (only two of the six rectangles adjacent modulator stripe 1041, 1042, 1043, 1044 are labeled for ease of illustration). One or more modulation signals such as a voltage or current can be applied to these electrodes and can modulate the phase of light propagating through each of the modulator stripes. Modulator stripes 1041 and 1042 and combiner 1062 define a modulated interferometer 1004-1. Modulator stripes 1043 and 1044 and combiner 1064 define a second modulated interferometer 1004-2. Also, a portion of modulator stripes 1045 and 1046 can be adjacent to electrode sets 1075 and 1078. A signal such as a voltage or current can be applied to these electrode sets 1075, 1078 and can modulate or control the phase of light propagating through these modulator stripes. Each modulator stripe is an optical waveguide comprising a material, such as an electro-optic material or a thermo-optic material, whose refractive index can be changed as a result of an applied change in electric-field or temperature. One or more of the optical modulator stripes 1041, 1042, 1043, 1044 also may be disposed adjacent to one or more "bias adjuster" electrodes 1071-1074. Control signals such as a voltage or current can be applied to these electrodes and can adjust the bias points for the two modulated interferometers 1004-1 and 1004-2.

In this embodiment, four of the six modulator stripes shown in FIG. 10 form two modulated interferometers (MI). These two MIs can have different drive signals supplied to them. In one example, both of these MIs are biased at the "null-bias" point to suppress the optical carrier (i.e., the un-modulated light) that is output from the combiner at the end of the MI. A notch filter 1091, 1093 can be used to remove any residual light at the un-modulated optical frequency (or at the laser wavelength). By using dual-drive electrodes rather than push-pull drive electrodes, one can produce single-sideband modulation rather than double-sideband modulation, as discussed above with reference to another example. In the example shown, the outputs from the two MIs are coupled to a dual-balanced photodetector pair that produces an RF output signal that is an up-converted or down-converted version of the input drive signal. In one class of applications, the first MI is driven with a frequency chirped signal and the second MI is driven with a local-oscillator signal to define the frequency shift of the up/down conversion. Such a chirped output is useful for applications like FMCW radar. Other outputs from the two MI are provided in optical form. Optical output 1 is a chirped laser tone that can be useful for applications like FMCW lidar. In this example, Optical output 2 is a CW laser tone that can be useful as a beacon for alignment purposes. Alternatively, it may be useful to drive the two MIs with different chirped waveforms.

Figure 11:
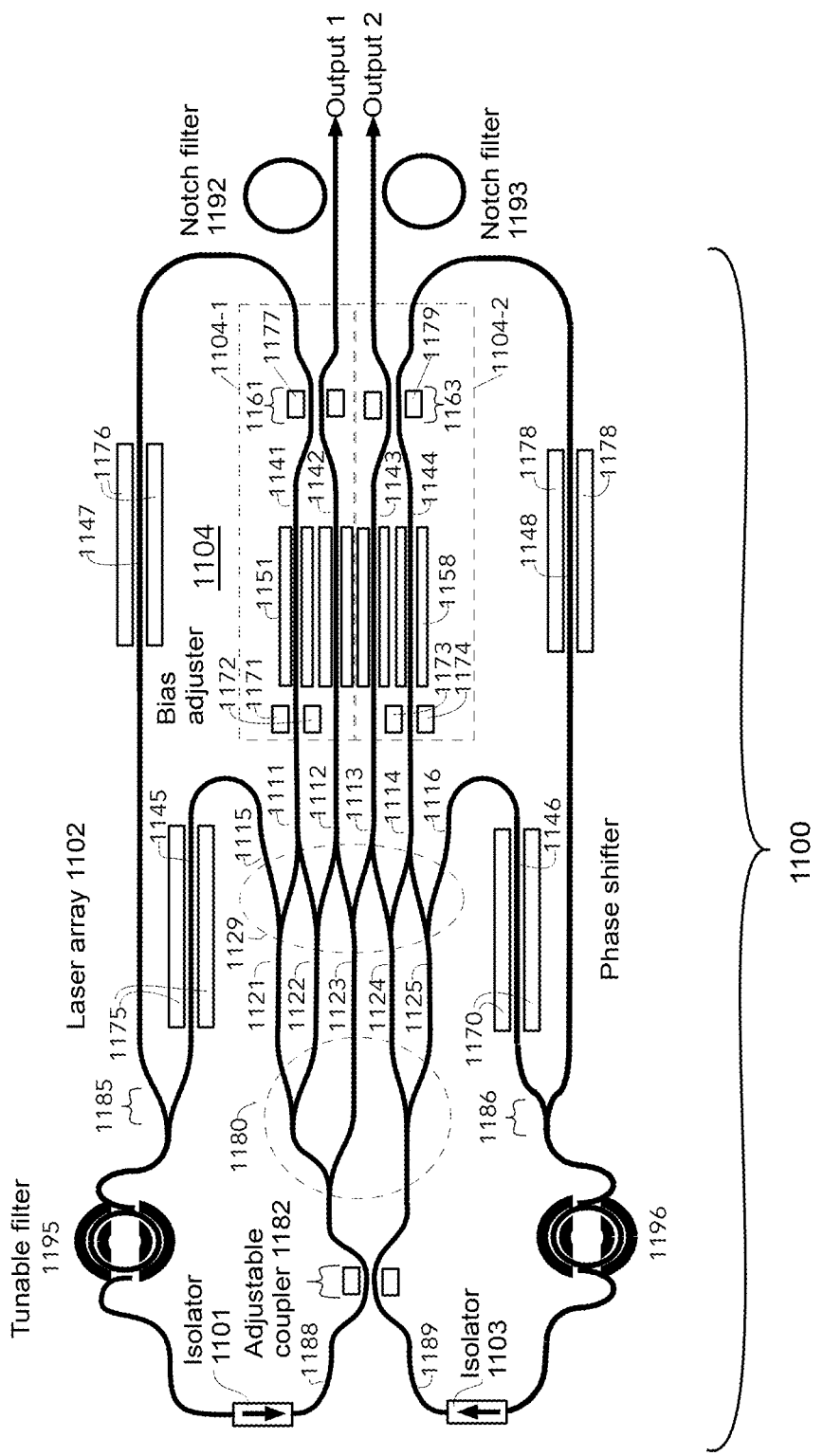
FIG. 11 depicts an embodiment of an integrated multi-stripe laser and multi-stripe modulator; the laser stripes are coupled through Y-junctions and are part of a ring cavity that includes some of the modulator stripes.

Embodiment 8: Multi-Stripe, Y-Junction Coupled Ring-Cavity Laser with Dual Mach-Zehnder Modulators FIG. 11 depicts yet another embodiment of a photonic source, labeled 1100 in this embodiment, which comprises a multi-stripe laser array 1102 preferably integrated as a photonic circuit with a multi-stripe modulator 1104. In this embodiment, the modulator stripes also are part of the laser cavity. The laser of this example has a ring cavity that includes all eight of the modulator stripes. Two of these modulator stripes 1145 and 1146 are coupled directly to the output end of the laser, which faces the multi-stripe modulator. These modulator stripes are used as phase shifters that adjust the phases of light in the multiple feedback loops of the ring-cavity laser, to ensure that their combination is constructive (in-phase) rather than destructive. The feedback loops preferably include optical isolators 1101 and 1103 in waveguide segments 1188 and 118, respectively, to ensure uni-directional travel of the light through the ring cavity. The feedback loops also can include tunable filters 1195, 1196 that select a particular spectral mode to feed back to the laser stripes. The multiple laser stripes are connected together through Y-junctions. Each Y-junction provides coupling only to two nearest neighbors. Thus, the end of the laser stripes that is opposite from the end facing the modulator has a tree-configured waveguide branching structure that distributes the light fed back from the multiple loops into the multiple laser stripes.

In the embodiment shown in FIG. 11, other modulator stripes 1141-1144 are part of modulated interferometers (MI) 1104-1 and 1104-2. These interferometers may be driven with various combinations of input signals. The four modulator stripes 1141-1144 shown in the figure have separate drive electrodes, which allows great versatility for production of modulation patterns, as discussed above with reference to other examples. The example shown in FIG. 11 has optional notch filters 1192, 1193 and bandpass filters 1195, 1196 that can be used to remove certain groups of spectral lines. The various filters shown are just representative of the diversity of filtering structures that could be connected to the modulators. The example shown collects the rejected laser-carrier light from a second output waveguide of each MI 1104-1, 1104-2 and re-uses that light to feed back to the laser through another modulator stripe 1147, 1148 that acts as a phase shifter. Thus, the generated laser light is used more efficiently. The modulator stripes connected to the output end of the laser are preferably coupled to the laser stripes through minimally reflecting interfaces. Likewise, the optical waveguides connected to the input end of the laser also are preferably coupled to the laser stripes through minimally reflecting interfaces. As illustrated by this example, some of the modulator stripes of the multi-stripe modulator are not connected directly to an output of a laser stripe. Instead, these modulator stripes 1147, 1148 are connected through an output of another modulator stripe.

In particular, FIG. 11 depicts a photonic source 1100 comprising a multi-stripe laser array 1102 and a multi-stripe modulator 1104. The multi-stripe laser array 1102 comprises laser stripes 1111-1116. The multi-stripe laser array 1102 further comprises supplemental laser stripes 1121-1125. Each laser stripe is an optical waveguide that has a light-emitting region. Light is emitted and propagates along the length of each laser stripe. The multi-stripe laser 1102 further comprises a Y-branch coupling region 1129 that is located between and that connect together laser stripes 1111-1116 and supplemental laser stripes 1121-1125. The multi-stripe modulator 1104 comprises modulator stripes 1141, 1142, 1143 and 1144 as well as modulator stripes 1145 and 1146 and modulator stripes 1147 and 1148. One end of laser stripes 1111-1116 faces modulator stripes 1141-1148. The opposite end of the laser stripes 1111-1116 faces the Y-branch coupling region 1129.

The end of the supplemental laser stripes 1121-1125 that is opposite from the Y-branch coupling region 1129 is connected to a cascaded-Y-branch optical splitter 1180. One end of modulator stripes 1141-1144 is connected to laser stripes 1111-1114. The opposite end of modulator stripes 1141 and 1142 is connected to optical combiner/coupler 1161. Likewise, the opposite end of modulator stripes 1143 and 1144 is connected to optical combiner/coupler 1163. Optical combiners 1161 and 1163 have two optical inputs and two optical outputs. One output of combiner/coupler 1161 is connected to optical modulator stripe 1147. The other output of combiner 1161 is connected to Output 1 of photonic source 1100 through a notch filter 1192. Likewise, one output of combiner/coupler 1163 is connected to optical waveguide modulator stripe 1148; the other output of combiner 1163 is connected to Output 2 of photonic source 1100 through notch filter 1193. One end of modulator stripes 1147 and 1148 is connected with outputs of combiners 1161 and 1163, respectively. The opposite end of modulator stripe 1147 is connected to an input of an optical waveguide combiner 1185. Likewise, the opposite end of modulator stripe 1148 is connected to an input of optical waveguide combiner 1186.

The multiple modulator stripes 1141-1148 and the multiple laser stripes 1111-1116 as well as the multiple supplemental laser stripes 1121-1125 are part of a ring-laser cavity. Modulator stripe 1145 and modulator stripe 1147 connect to the inputs of optical waveguide combiner 1185. The output of combiner 1185 connects to an input of adjustable optical waveguide coupler 1182 through tunable filter 1195, optical isolator 1101 and waveguide segment 1188. Similarly, modulator stripe 1146 and modulator stripe 1148 connect to the inputs of optical waveguide combiner 1186. The output of combiner 1186 connects to a second input of optical waveguide coupler 1182 through tunable filter 1196 optical isolator 1103 and waveguide segment 1189. One or both outputs of optical waveguide coupler 1182 connect to Y-branch optical splitter 1180.

A portion of each modulator stripe 1141, 1142, 1143, 1144 may be disposed adjacent one or more electrodes 1151-1158 (only two of the eight rectangles adjacent modulator stripes 1141, 1142, 1143, 1144 are labeled for ease of illustration in FIG. 11). One or more modulation signals such as a voltage or current can be applied to these electrodes and can modulate the phase of light propagating through each of the adjacent modulator stripes. Also, a portion of modulator stripes 1145 and 1146 may be disposed adjacent electrode sets 1175 and 1170. And, a portion of modulator stripes 1147 and 1148 may be disposed adjacent electrode sets 1176 and 1178. A signal such as a voltage or current can be applied to these electrodes and can modulate or control the phase of light propagating through these modulator stripes. Each modulator stripe comprises an optical waveguide comprising a material, such as an electro-optic material or a thermo-optic material, whose refractive index can be changed as a result of an applied change in electric-field or temperature. One or more of the optical modulator stripes 1141, 1142, 1143, 1144 also may be disposed adjacent one or more "bias adjuster" electrodes 1171-1174. Control signals such as a voltage or current can be applied to these electrodes and can adjust the bias points of the modulated interferometers 1104-1 and 1104-2. Adjustable optical combiner/couplers 1161 and 1163 as well as adjustable coupler 1182 also can be located adjacent to one or more electrode sets (see the rectangles depicted next to these couplers). Control signals such as a voltage or current can be applied to these electrodes and can adjust the relative amplitudes and phases of light coupled from the two outputs of each optical waveguide coupler 1161, 1163, 1182.

For an exemplary application, a first MI 1104-1 is biased and driven with a periodic up-chirped RF waveform to produce a single-sideband suppressed-carrier modulated optical waveform centered at a first optical frequency. A second MI 1104-2 is biased and driven with a periodic down-chirped RF waveform to produce a single-side suppressed-carrier modulated optical waveform centered at a second optical frequency. The bandwidths of the two chirps can be the same or can be different, depending on the constraints of the application. The two optical outputs can be used for FMCW lidar. Having an upward chirp in a first output and a downward chirp in a second output allows the lidar system to simultaneously detect the distance to an object and the relative in-line (or closing) velocity of that object. Since the laser is operated CW with uni-directional propagation of the laser light in a long ring cavity, the spectral linewidth of the laser can be very small compared to the spectral linewidth achieved with a frequency-tunable, Fabry-Perot cavity laser.

The various examples discussed above of an integrated multi-stripe laser and multi-stripe modulator are provided to illustrate the kinds of laser structures, laser-stripe coupling, and modulator structures and functions that could be achieved with this invention. Many other combinations of the various laser structures, laser-stripe coupling methods, reflector structures, and modulator structures could be envisioned. Although not shown explicitly in the examples discussed above, it may be beneficial to have additional optical isolators placed before or after the modulator stripes to minimize any unwanted reflection from the modulator back into the laser stripes.

Examples of Channel (2D) Waveguide Electro-Optic Modulator Stripes.

Figure 12A:
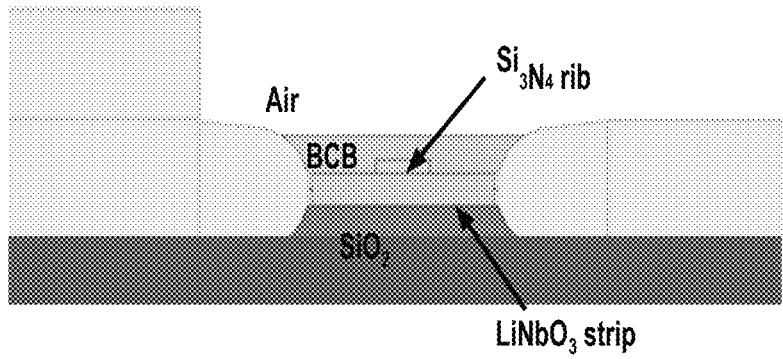
FIGS. 12a-12c depict examples of an electro-optic waveguide of a modulator stripe.
Figure 12B:
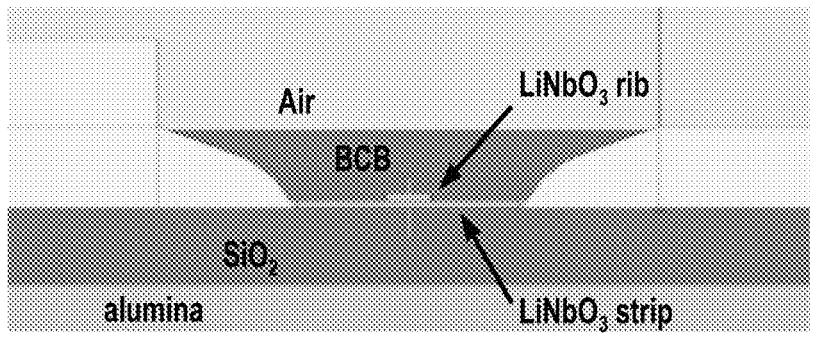
Figure 12C:
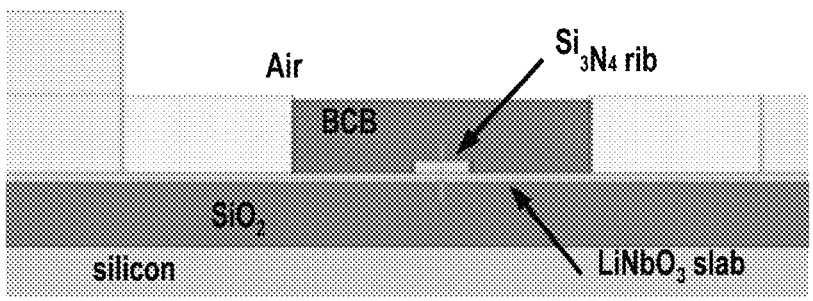

The various embodiments of multi-stripe modulators described above make use of electro-optic modulation of the phase of the light propagating through modulator stripes located within them. The various embodiments show electrodes that apply a voltage which changes the effective refractive index of the waveguide material. Examples of materials that have a fairly large inherent electro-optic coefficient include lithium niobate, barium titanate, indium phosphide, gallium arsenide, silicon carbide and some polymers. Other materials such as silicon can have their effective refractive index changed due to changes in the free-carrier concentration. FIGS. 12*a*-12*c* show cross-sectional illustrations for several embodiments of optical waveguides formed in thin-film lithium niobate. These embodiments illustrate the relation between the electrode structure and the electrooptic waveguide for electrodes placed at the sides of the waveguides. Other modulators could have their electrodes placed above or below the waveguides instead of at the sides.

The exemplary waveguides shown in FIGS. 12*a*-12*c* are rib waveguides that have a strip of x-cut lithium niobate located above a lower-cladding layer of silicon dioxide. Some of the waveguides have ribs of lithium niobate and others have ribs of silicon nitride. The upper cladding material for these examples is BCB (a low-dielectric-constant polymer). For the structures of FIGS. 12*a* and 12*b*, the lithium niobate strip has a finite width and the metal electrodes are located adjacent to the two sides of the lithium niobate strip, separated from the lithium niobate by a thin buffer material that has a low refractive index (such as silicon dioxide (see D. Yap, R. G. Quarfoth, T. D. Rockwood, "Push-pull photonic modulator," U.S. Pat. No. 10,451,951 B1 (2019)), the disclosure of which is hereby incorporated herein by reference). The rib, strip and buffer can be designed to allow the two metal electrodes to be spaced closer together, thereby increasing the strength of the applied electric-field that modulates the effective refractive index. For the structure of FIG. 12*c*, the lithium niobate layer is a slab whose width extends through multiple modulator stripes. For this structure, the metal electrodes are located above the lithium niobate slab and are displaced sufficiently far away from the rib to reduce the absorption of light by the electrode metal (see A. Honardoost, R. Safian, A. Rao and S. Fathpour, "High-speed modeling of ultracompact electrooptic modulators," *Journal of Lightwave Technology*, v. 36, n. 24, p. 5893 (2018), the disclosure of which is hereby incorporated herein by reference).

Examples of Methods for Coupling Laser Stripes and Modulator Stripes.

Various methods have previously been developed to physically integrate the materials suitable for a laser with the materials suitable for a modulator and the materials suitable for a photodetector. Several of these methods are illustrated schematically in FIG. 13*a* (see G. de Valicourt, et al., "Photonic integrated circuit based on hybrid III-V/silicon integration," *Journal of Lightwave Technology*, v. 36, n 2, p. 265 (2018), the disclosure of which is hereby incorporated herein by reference). With all of these methods, the different devices are integrated onto the same (or common) substrate. With the edge-coupling method, the waveguide edge for one device is butted against the waveguide edge of another device. A lens or a waveguide spot-size transformer can be used to adapt the different sizes of the waveguided optical fields in the different devices should that be necessary or convenient. Edge coupling is especially suitable when the laser has reflecting surfaces formed at one or both of its two ends to define a laser cavity. Examples of such lasers are given in FIGS. 2, 4, 7 and 9 which include partially reflecting interfaces 230, 430, 730 and 930 where the partially reflecting interfaces may be implemented by two waveguides with ends that abut each other, such as in the case of the embodiment of FIG. 2 where stripe (a waveguide) 211 abuts stripe (a waveguide) 241 of the modulator 204. This is especially true when the laser stripe and the modulator stripe comprise different materials whose refractive index are different. The laser in such examples could be fabricated as a separate chip that is then bonded onto a substrate on which the modulator is fabricated. This assembly approach is illustrated in FIG. 13b (see T. Shimizu, et al., "Multichannel and high-density hybrid integrated light source with a laser diode array on a silicon optical waveguide platform for interchip optical interconnection," *Photonics Research*, v. 2, n. 3, p. A19 (2014), the disclosure of which is hereby incorporated herein by reference).

Another approach bonds the material for one device onto the material for another device along the longitudinal or transverse plane of the laser and modulator stripes. This bonding can be done at the wafer scale or can be done for individual die or pieces. For this approach, tapers are often used to shift the light in the direction normal to the substrate plane from the layers of one device to the layers of another device. One example of this approach is illustrated in FIG. 13c. (see K. Van Gasse, R. Wang and G. Roelkens, "27 dB gain III-V-on-silicon semiconductor optical amplifier with >17 dBm output power," *Optics Express*, v. 27, n. 1, p. 293 (2019), the disclosure of which is hereby incorporated herein by reference). For this approach the material layers of the laser is bonded on a substrate in which the waveguides for the modulator and other waveguide components (such as filters and couplers) are formed. The laser is formed from III-V semiconductor layers. The modulator (elements 204, 404-704 and 904-1104 of the various embodiment) is preferably formed from a silicon-on-insulator wafer. In many cases, wafers of the two materials are bonded together and the III-V substrate is removed to expose the material layers for the laser. The laser devices are then fabricated, with the substrate of the silicon-on-insulator wafer serving as the new base of the integrated structures.

The material for a laser, such as III-V semiconductor layers also have been integrated together with lithium niobate waveguides. For the example illustrated in FIG. 14a, both the III-V semiconductor light-emitter structure and the lithium niobate waveguide structure are fabricated separately (see S. Aghaeimeibodi, et al., "Integration of quantum dots with lithium niobate photonics," *Applied Physics Letters*, v. 113, p. 221102 (2018), the disclosure of which is hereby incorporated herein by reference). Then, the thin III-V device is detached from its original substrate and is placed onto the lithium niobate waveguide.

Figure 14B:
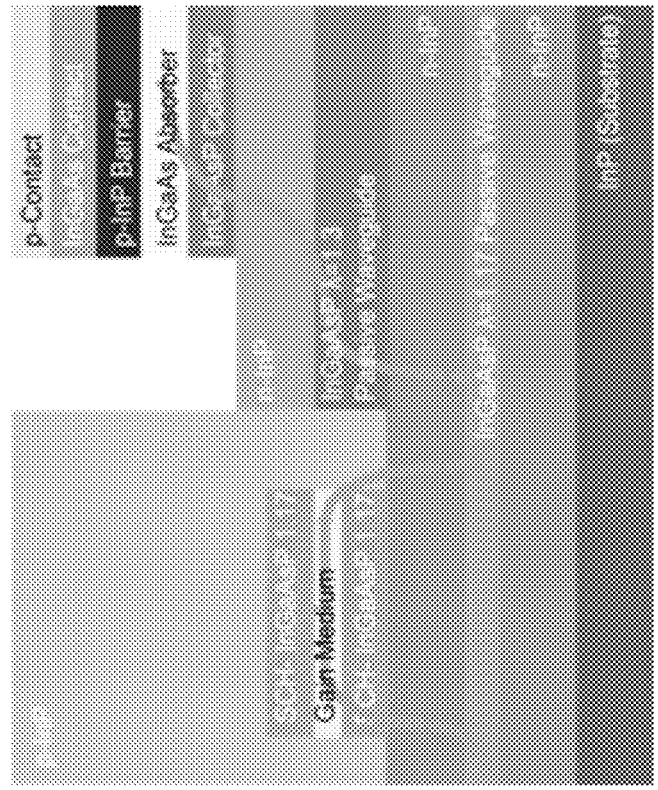
FIGS. 14a and 14b show additional examples of methods for integrating laser, modulator and photodetector materials.
Figure 14A:
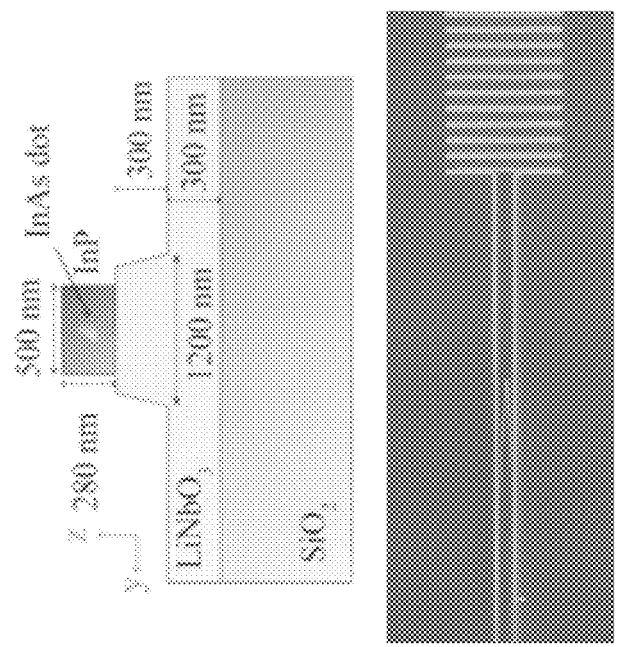

In some embodiments, the laser, modulator and photodetector all can be fabricated from material that are compatible with growth on a common substrate. One example is devices fabricated from the InP-based family of materials. FIG. 14b shows an example of a laser structure that is integrated with a waveguide-coupled photodetector structure through an underlying passive waveguide (see M. Anagnosti, et al., "Record gain×bandwidth (6.1 THz) monolithically integrated SOA-UTC photoreceiver for 100-Gbit/s applications," *Journal of Lightwave Technology*, v. 33, n. 6, p. 1186 (2015), the disclosure of which is hereby incorporated herein by reference). Modulators may also be fabricated from the two sets of passive waveguide layers in this integrated structure.

Examples of integrated multi-stripe laser and multi-stripe modulators that are compatible with the bonding and the epitaxial-growth methods of integration are the devices shown, for example, in FIGS. 5, 6, 10 and 11.

The fabrication technologies for achieving the various integrated multi-stripe laser and multi-strip modulator devices of this invention are available. For example, on-chip optical isolators that combine magneto-optic materials with silicon or silicon nitride waveguides have been demonstrated (see Y. Zhang, et al., "Monolithic integration of broadband optical isolators for polarization-diverse silicon photonics," *Optica*, v. 6, n. 4, p. 473 (2019), the disclosure of which is hereby incorporated herein by reference). Partially reflecting interfaces can be produced by structures such as interfaces between waveguides comprising materials of differing refractive index, abrupt changes in the dimensions of the waveguide core region, and gratings. Interfaces having minimal reflection can be produced by structures such as anti-reflective coatings and adiabatic tapers. Reflectors can be produced by structures such as gratings and metal coatings on etched or cleaved surfaces. Laser stripes can be fabricated from material structures such as InGaAs/InP, GaAs/AlGaAs, InGaAs/InAlAs, InGaN/AlGaN, InAs/GaSb, quantum wells, superlattices, quantum cascades, interband cascades and quantum dots. Modulator stripes that operate using electro-optic modulation of the effective material index can be fabricated from material structures such as $LiNbO_3/SiO_2$, $Si/SiO_2$, GaInAsP/InP, GaAs/AlGaAs and InGaAlAs/InAlAs. Passive waveguides can be fabricated from the same materials used for the electro-optic waveguides as well as from material structures such as $Si_3N_4/SiO_2$ and polymers. Photodetectors can be fabricated from material structures such as InGaAs/InP, GaAs/AlGaAs, InAs/GaSb, Si and Ge. The various references cited in this document provide many examples of these structures.

Having now described the invention in terms of several different embodiment thereof and in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and various embodiments are presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . "

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A photonic source comprising:
  a. a multi-stripe laser array, the multi-stripe laser array including a plurality of laser stripes including a first laser stripe producing a first output laser light, a second laser stripe producing a second output laser light, and a third laser stripe producing a third output laser light; the first output laser light, the second output laser light, and the third output laser light all being coherent with each other; and
  b. a multi-stripe modulator, the multi-stripe modulator having a plurality of modulator stripes, including a first modulator stripe having a first modulator input port, a second modulator stripe having a second modulator input port, and a third modulator stripe having a third modulator input port, a portion of the first output laser light being directly optically coupled to the first modulator input port of the first modulator stripe, a portion of the second output laser light being directly optically coupled to the second modulator input port of the second modulator stripe and the third output laser light being directly optically coupled to the third modulator input port of the third modulator stripe.

2. The photonic source of claim 1 wherein light from the first laser stripe is coupled into the second laser stripe and into the third laser stripe; light from the second laser stripe is coupled into the first laser stripe and into the third laser stripe; and light from the third laser stripe is coupled into the first laser stripe and into the second laser stripe.

3. The photonic source of claim 1 wherein the first laser stripe is coupled to the first modulator input port without passing through an optical combiner or splitter interface; the second laser stripe is coupled to the second modulator input port without passing through an optical combiner or splitter interface; and the third laser stripe is coupled to the third modulator input port without passing through an optical combiner or splitter interface.

4. The photonic source of claim 2 wherein the first laser stripe is coupled to the first modulator input port through a first partially or minimally reflecting interface; the second laser stripe is coupled to the second modulator input port through a second partially or minimally reflecting interface; and the third laser stripe is coupled to the third modulator input port through a third partially or minimally reflecting interface.

5. The photonic source of claim 2 wherein multi-stripe laser further comprises a diffraction coupling section or a Talbot spacer.

6. The photonic source of claim 5 wherein light is coupled between the first laser stripe, the second laser stripe, and the third laser stripe through the diffraction coupling section or Talbot spacer.

7. The photonic source of claim 6 wherein the length of the diffraction coupling section or Talbot spacer is a multiple of one-half a Talbot distance.

8. The photonic source of claim 6 wherein the length of the diffraction coupling section or Talbot spacer also is greater than or equal to one Talbot distance.

9. The photonic source of claim 5 wherein the first, second and third laser stripes are located between the diffraction coupling section or Talbot spacer and the first, second and third modulator stripes.

10. The photonic source of claim 5 wherein the diffraction coupling section or Talbot spacer has a reflector on the end of the diffraction coupling section or Talbot spacer that is opposite from a side thereof facing the laser stripes.

11. The photonic source of claim 10 wherein the reflector has a scalloped profile.

12. The photonic source of claim 10 wherein the reflector comprises a Bragg reflector.

13. The photonic source of claim 2 wherein the multi-stripe laser further comprises a fourth laser stripe and a fifth laser stripe, the fourth laser stripe being disposed between the first laser stripe and the second laser stripe, the fifth laser stripe being disposed between the second laser stripe and the third laser stripe.

14. The photonic source of claim 13 wherein the fourth laser stripe and the fifth laser stripe are located between a diffraction coupling section or Talbot spacer and the multi-stripe modulator and the fourth laser stripe and the fifth laser stripe have reflectors at the ends thereof that face the multi-stripe modulator.

15. The photonic source of claim 14 wherein the reflectors at the ends of the fourth and fifth laser stripes are Bragg reflectors.

16. The photonic source of claim 2 wherein the multi-stripe laser has a first interstripe region between the first laser stripe and the second laser stripe that has high refractive index and a second interstripe region between the second laser stripe and the third laser stripe that has high refractive index.

17. The photonic source of claim 16 wherein light is coupled between the first laser stripe, the second laser stripe, and the third laser stripe by means of leaky-wave coupling through the first interstripe region located between the first laser stripe and the second laser stripe and by means of leaky-wave coupling through the second interstripe region located between the second laser stripe and the third laser stripe.

18. A photonic source comprising a multi-stripe laser array and a multi-stripe modulator wherein the multi-stripe laser array has at least first, second and third laser stripes located between a diffraction coupling section or Talbot spacer and the multi-stripe modulator, the multi-stripe laser array further comprises at least a fourth laser stripe and a fifth laser stripe, the first, second and third laser stripes being located between the fourth laser stripe and the fifth laser stripe, the fourth laser stripe having a reflector located at an end thereof facing the multi-stripe modulator, the fifth laser stripe having a reflector located at an end thereof facing the multi-stripe modulator, the first and second mentioned reflectors defining ends of a laser cavity.

19. The photonic source of claim 1 further comprising a photodetector coupled to the multi-stripe modulator.

20. The photonic source of claim 1 wherein the first modulator stripe comprises an electro-optic waveguide and a first set of electrodes and the second modulator stripe comprises an electro-optic waveguide and a second set of electrodes.

21. The photonic source of claim 20 wherein the third modulator stripe comprises an electro-optic waveguide and a third set of electrodes.

22. The photonic source of claim 20 wherein the first modulator stripe and the second modulator stripe are connected together by an optical combiner located at the end of the first and second modulator stripes opposite from an end thereof facing the laser stripes.

23. The photonic source of claim 22 wherein the first, second and third modulator stripes are coupled with an optical output that is optionally coupled into free space.

24. The photonic source of claim 1 wherein the portion of the first output laser light is directly optically coupled to the first modulator stripe without passing through an optical combiner or splitter, the portion of the second output laser light is directly optically coupled to the second modulator stripe without passing through an optical combiner or splitter and the third output laser light is directly optically coupled to the third modulator stripe without passing through an optical combiner or splitter.

25. A photonic source comprising a multi-stripe laser and a multi-stripe modulator: the multi-stripe laser comprises a first laser stripe producing a first laser light, and a second laser stripe producing a second output laser light coherent with the first laser light, wherein a portion of the first output laser light from the first laser stripe is coupled directly to a first modulator input port of the multi-stripe modulator without passing through an optical combiner or splitter; and a portion of the second output laser light from the second laser stripe is coupled directly to a second modulator input port of the multi-stripe modulator without passing through an optical combiner or splitter.

* * * * *